(12) United States Patent  
Hirler et al.

(10) Patent No.: US 8,860,126 B2  
(45) Date of Patent: Oct. 14, 2014

(54) SEMICONDUCTOR DEVICE WITH A LOW OHMIC CURRENT PATH

(71) Applicant: Infineon Technologies Austria AG, Villach (AT)

(72) Inventors: Franz Hirler, Isen (DE); Andreas Meiser, Sauerlach (DE)

(73) Assignee: Infineon Technologies Austria AG, Villach (AT)

( * ) Notice: Subject to any disclaimer, the term of this patent is extended or adjusted under 35 U.S.C. 154(b) by 27 days.

(21) Appl. No.: 13/776,799

(22) Filed: Feb. 26, 2013

(65) Prior Publication Data

US 2013/0175609 A1     Jul. 11, 2013

Related U.S. Application Data

(62) Division of application No. 13/088,555, filed on Apr. 18, 2011, now Pat. No. 8,404,557.

(51) Int. Cl.
*H01L 21/66*     (2006.01)

(52) U.S. Cl.
USPC ............ 257/328; 438/138; 257/E21.41

(58) Field of Classification Search
USPC .......... 257/328, 330, 332; 438/137, 138, 270, 438/272
See application file for complete search history.

(56) References Cited

U.S. PATENT DOCUMENTS

| 6,242,320 | B1 | 6/2001 | So |
| 7,375,395 | B2 | 5/2008 | Tihanyi |
| 8,343,818 | B2 | 1/2013 | Zhu et al. |
| 2006/0068545 | A1 | 3/2006 | Goldbach |
| 2006/0076615 | A1 | 4/2006 | Tihanyi |
| 2010/0320536 | A1 | 12/2010 | Schmidt |
| 2012/0146130 | A1 | 6/2012 | Hirler et al. |
| 2012/0146133 | A1 | 6/2012 | Hirler et al. |

FOREIGN PATENT DOCUMENTS

| CN | 101288179 A | 10/2008 |
| DE | 102006046869 A1 | 4/2008 |
| DE | 102011056157 A1 | 6/2012 |
| JP | 2004356383 A | 12/2004 |
| TW | 439187 B | 6/2001 |

*Primary Examiner* — Reema Patel

(74) *Attorney, Agent, or Firm* — Murphy, Bilak & Homiller, PLLC

(57) ABSTRACT

A semiconductor device includes a semiconductor substrate having a main horizontal surface, a back surface arranged opposite the main horizontal surface, a vertical transistor structure including a doped region and a control electrode arranged next to the main horizontal surface, an insulating region arranged at or close to the back surface, a deep vertical trench extending from the main horizontal surface through the semiconductor substrate and to the insulating region, an insulating layer arranged on a side wall of the deep vertical trench, and a low ohmic current path extending at least partially along the insulating layer and between the main horizontal surface and the back surface. A first metallization is in ohmic contact with the doped region and arranged on the main horizontal surface. A control metallization is arranged on the back surface and in ohmic contact with the control electrode via the low ohmic current path.

6 Claims, 33 Drawing Sheets

US 8,860,126 B2

SEMICONDUCTOR DEVICE WITH A LOW OHMIC CURRENT PATH

PRIORITY CLAIM

This application is a Divisional of U.S. application Ser. No. 13/088,555, filed on 18 Apr. 2011, the content of said application incorporated herein by reference in its entirety.

TECHNICAL FIELD

This specification generally relates to methods for forming semiconductor devices, in particular to methods for forming semiconductor transistors with a semiconductor substrate having a via region between a first surface and a second surface of the semiconductor substrate for connecting a control electrode of the semiconductor transistor.

BACKGROUND

Many functions of modern devices in automotive, consumer and industrial applications, such as computer technology, mobile communications technology, converting electrical energy and driving an electric motor or an electric machine, rely on semiconductor devices, in particular semiconductor transistors such as field-effect transistors (FETs), for example power MOSFETs (Metal Oxide Semiconductor Field-Effect Transistors).

In many applications, vertical MOSFETs with a source metallization and a gate metallization on the front side of the semiconductor substrate, and a drain metallization on the back side of the semiconductor substrate are used. There are, however, applications in which it is desirable for the source metallization of the MOSFET to be located on the front side of its semiconductor substrate whereas the gate metallization and the drain metallization are located on the back side of the semiconductor substrate. Such a device is in the following referred to as source-down MOSFET because the MOSFET can be soldered up-side down with its front side (source metallization is directed downwardly) to a simple lead frame. Thereby, additional costs for a segmented lead frame may be avoided. Furthermore, source-down MOSFETs may particularly efficiently be cooled through the source metallization which is close to the channel region. Further, in applications in which the source metallization is during operation at reference potential, typically at ground, no further insulation of the source-down MOSFET may be required. This makes source-down MOSFETs particularly interesting for automotive applications in which the lead frame to which the source metallization of the MOSFET is soldered or glued may simply be mounted or connected to the chassis at ground potential.

For source-down MOSFETs, a conductive via through the semiconductor substrate is typically formed to connect the gate metallization and a gate electrode of the MOSFET. Furthermore, sufficiently reliable electrically insulating regions, for example thermal oxides, are often desired on top and bottom sides of the semiconductor substrate, in particular for power semiconductor devices. However, forming of sufficiently reliable insulating thermal oxides typically requires higher temperatures and thus poses limits for the manufacturing. Accordingly, the manufacturing of such devices is often complex and/or expensive.

SUMMARY

According to an embodiment, a method for forming a semiconductor device is provided. The method includes providing a semiconductor substrate having a main horizontal surface, an opposite surface, and a dielectric region. The dielectric region is arranged in the semiconductor substrate and spaced apart from the main horizontal surface and the opposite surface. A deep vertical trench is etched from the main horizontal surface into the semiconductor substrate at least close to a horizontal surface of the dielectric region. The deep vertical trench can be etched to the horizontal surface of the dielectric region by using the dielectric region as an etch stop. A vertical transistor structure is formed in the semiconductor substrate. Forming the transistor structure includes forming a first doped region in the semiconductor substrate. A first metallization is formed on the main horizontal surface so that the first metallization is in ohmic contact with the first doped region. The opposite surface is processed to thin the semiconductor substrate at least close to the dielectric region.

According to an embodiment, a semiconductor device having a semiconductor substrate is provided. The semiconductor substrate includes a main horizontal surface, a back surface arranged opposite to the main horizontal surface, and a vertical transistor structure. The transistor structure includes a first doped region and a control electrode arranged next to the main horizontal surface. The semiconductor device further includes an insulating region arranged at the or close to the back surface, and a deep vertical trench which extends from the main horizontal surface into the semiconductor substrate and to the insulating region. On a side wall of the deep vertical trench an insulating layer is arranged. A low ohmic current path extends at least partially along the insulating layer and between the main horizontal surface and the back surface. The semiconductor device further includes a first metallization in ohmic contact with the first doped region and a control metallization in ohmic contact with the control electrode via the low ohmic current path. The first metallization is arranged on the main horizontal surface. The control metallization is arranged on the back surface.

According to an embodiment, a method for forming a semiconductor device is provided. The method includes providing a first semiconductor wafer having a first horizontal surface and providing a second semiconductor wafer having a second horizontal surface. A dielectric region is formed at the first horizontal surface and/or at the second horizontal surface. A semiconductor substrate having a main horizontal surface and an opposite surface is formed. Forming the semiconductor substrate includes forming a wafer stack by wafer bonding the first semiconductor wafer and the second semiconductor wafer so that the dielectric region is at least partially embedded, typically completely embedded, in the wafer stack. A deep vertical trench is etched from the main horizontal surface into the semiconductor substrate at least close to a horizontal surface of the dielectric region. The deep vertical trench can be etched to the horizontal surface of the dielectric region by using the dielectric region as an etch stop. An insulating layer is formed at a side wall of the deep vertical trench. A first metallization is formed on the main horizontal surface. The opposite surface is processed to form a back surface by thinning the semiconductor substrate at least close to the dielectric region. A control metallization is formed on the back surface. The method is performed so that a low ohmic current path is formed between the main horizontal surface and the control metallization. The low ohmic current path extends at least partially along the insulating layer.

According to an embodiment, a method for forming a semiconductor device is provided. A semiconductor wafer having a first horizontal surface and an opposite surface is provided. A dielectric region is formed at the first horizontal surface. At least one epitaxial layer is formed on the first horizontal surface and extends to a main horizontal surface. Forming the at least one epitaxial layer includes an epitaxial lateral overgrowth process so that the dielectric region is completely embedded. A deep vertical trench is etched from the main horizontal surface into the at least one epitaxial layer at least close to a horizontal surface of the dielectric region. The deep vertical trench can be etched to the horizontal surface of the dielectric region by using the dielectric region as an etch stop. An insulating layer is formed at a side wall of the deep vertical trench. A first metallization is formed on the main horizontal surface. The semiconductor wafer is thinned at the opposite surface at least close to the dielectric region to form a back surface. A control metallization is formed on the back surface. The method is performed so that a low ohmic current path is formed between the main horizontal surface and the control metallization. The low ohmic current path extends at least partially along the insulating layer.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of the embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
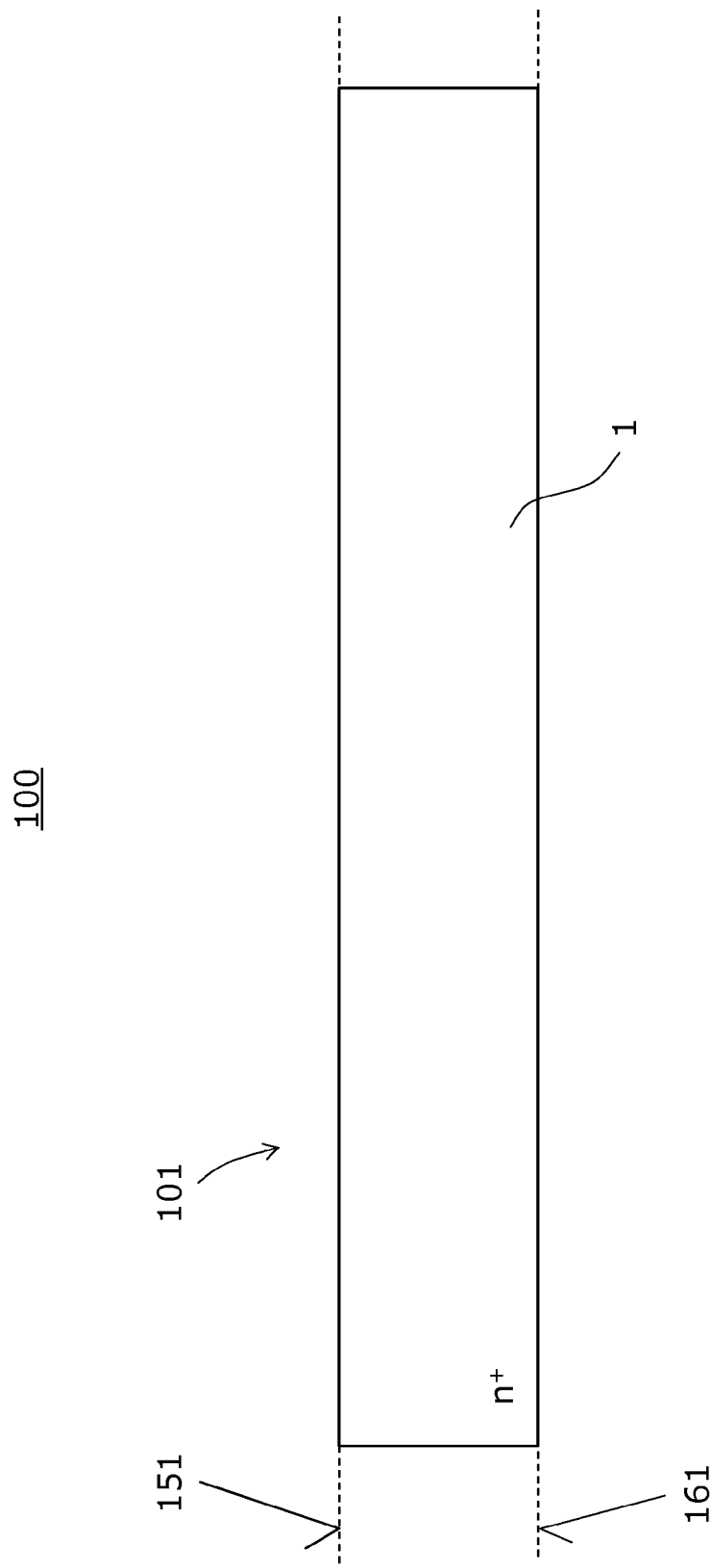
FIGS. 1-22 schematically illustrate, in vertical cross-sections, processes of manufacturing a semiconductor device according to one or more embodiments.

In the following Detailed Description, reference is made to the accompanying drawings, which form a part hereof, and in which is shown by way of illustration specific embodiments in which the invention may be practiced. In this regard, Spatially relative terms, such as "top", "bottom", "front", "back", "leading", "trailing", "under", "below", "lower", "over", "upper" etc., is used with reference to the orientation of the Figure(s) being described. These terms are used for ease of description to explain the positioning of one element relative to a second element. Because components of embodiments can be positioned in a number of different orientations, the spatially relative terms are used for purposes of illustration and are in no way limiting. These terms are intended to encompass different orientations of the device in addition to different orientations than those depicted in the figures. Further, terms such as "first", "second", and the like, are also used to describe various elements, regions, sections, etc. and are also not intended to be limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise. Also, U.S. patent application Ser. No. 12/836,422 filed on 14 Jul. 2010 and U.S. patent application Ser. No. 12/964,865 filed on 10 Dec. 2010 are both incorporated herein by reference in their entirety.

The term "horizontal" as used in this specification intends to describe an orientation substantially parallel to a first or main horizontal surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n−" means a doping concentration which is less than the doping concentration of an "n"-doping region while an "n+"-doping region has a larger doping concentration than the "n"-doping region. However, indicating the relative doping concentration does not mean that doping regions of the same relative doping concentration have to have the same absolute doping concentration unless otherwise stated. For example, two different n+-doping regions can have different absolute doping concentrations. The same applies, for example, to an n+-doping and a p+-doping region.

Specific embodiments described in this specification pertain to, without being limited thereto, semiconductor devices and manufacturing methods therefore, in particular to three terminal semiconductor transistors such as MOSFETs, IGBTs (Insulated-Gate Bipolar Transistors) and BJTs (Bipolar Junction Transistors). The semiconductor devices are typically vertical power semiconductor devices.

The term "power semiconductor device" as used in this specification intends to describe a semiconductor device on a single chip with high voltage and/or high current switching capabilities. In other words, power semiconductor devices are intended for high current, typically in the Ampere range, and/or voltages above 10 V, more typically above 20 V.

In the context of the present specification, the term "in ohmic contact" intends to describe that there is an ohmic electric connection or ohmic current path between two regions, portion or parts of a semiconductor device through the semiconductor device or between different electrodes of one or more devices or between a electrode or a metallization and a portion or a part of the semiconductor device.

In the context of the present specification, the term "metallization" intends to describe a region or a layer with metallic or near metallic properties with respect to electric conductivity. A metallization may be in contact with a semiconductor region to form an electrode, a pad and/or a terminal of the semiconductor device. The metallization may be made of a metal such as Al, Cu, W, Ti, Au, Ag, Ni, V, Sn and Co but may also be made of a material with metallic or near metallic properties with respect to electric conductivity such as highly doped n-type or p-type poly-Si, TiN or an electrically conductive silicide such as $WSi_2$. The metallization may also include different electrically conductive materials, for example a stack of those materials.

In the following, embodiments pertaining to semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body can be made of any semiconductor material suitable for manufacturing a semiconductor device. Examples include elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaP), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body comprises a wide band-gap material such as SiC or GaN which has a high breakdown voltage and high critical avalanche field strength, respectively, the doping of the respective semiconductor regions can be chosen higher which reduces the on-resistance $R_{on}$. Furthermore, the leakage current across pn-junctions formed in wide band-gap materials is often negligible. The term "wide band-gap semiconductor material" as used in this specification intends to describe a semiconductor material with an electronic band-gap of about at least two electron volts (eV).

With respect to FIGS. 1 to 22 methods for forming a semiconductor device 100 according to several embodiments are illustrated in respective vertical cross-sections. These figures show vertical cross-sections through a semiconductor substrate during or after particular method processes. In a first process, a first semiconductor wafer 101 or first semiconductor substrate 101 having a first horizontal surface 151 and an opposite surface 161 is provided. In the following, the opposite surface 161 is also referred to as second horizontal surface. The first semiconductor wafer 101 may be made of any suitable semiconductor material such as Si or GaN or SiC. Typically, the first semiconductor wafer 101 includes a first semiconductor layer 1. In the exemplary embodiment illustrated in FIG. 1, the first semiconductor layer 1 extends between the first horizontal surface 151 and the second horizontal surface 161. As indicated in FIG. 1, the first semiconductor layer 1 may be of a first conductivity type and heavily doped ($n^+$-type). In this embodiment, a portion of the first semiconductor layer 1 later typically forms a drain contact region of a vertical n-channel MOSFET or a collector region of a vertical npn-BJT.

Alternatively, the first semiconductor layer 1 is of the second conductivity type and heavily doped ($p^+$-type). Accordingly, a portion of the first semiconductor layer 1 may, for example, later form a collector region of a vertical n-channel IGBT.

Thereafter, a dielectric region 8 is formed at the first horizontal surface 151. The dielectric region 8 typically includes $SiO_2$. In the exemplary embodiment illustrated in FIG. 2, the dielectric region 8 is formed by local oxidation of silicon and thus forms a LOCOS-region (LOCal Oxidation of Silicon). This process may include a chemical vapor deposition (CVD) of $SiO_2$ or thermal oxidation to form a thin pad oxide on the first horizontal surface 151, followed by a CVD deposition of a $Si_3N_4$ (silicon nitride) layer on the thin pad oxide and masked etching the $Si_3N_4$ layer to form a nitride mask. Thereafter, a LOCOS-region 8 may be formed by thermal growth processes and removal of the nitride mask. For sake of clarity, the thin pad oxide and the nitride mask are not illustrated in FIG. 2.

Thereafter, the first semiconductor wafer 101 is typically planarized at the first horizontal surface 151, for example in a CMP-process (Chemical Mechanical Polishing) or a mechanical polishing process. The CMP-process may also be used to remove the thin pad oxide and the nitride mask. The resulting semiconductor wafer 101 is illustrated in FIG. 3.

Figure 4:
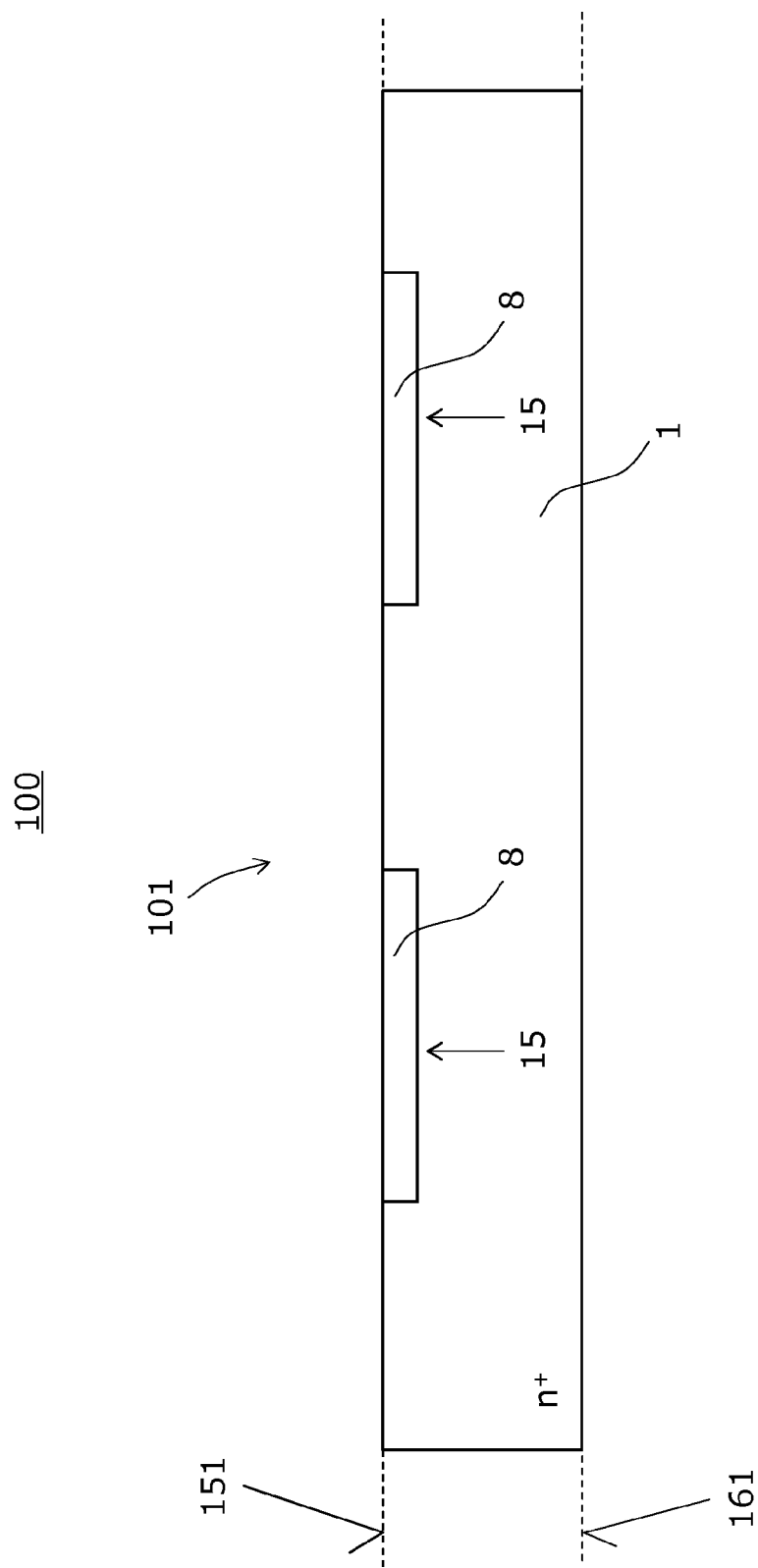

Alternatively, the dielectric region 8 may be formed by etching a shallow trench 15 from the main horizontal surface 151 into the semiconductor wafer 101, and by depositing of $SiO_2$, for example in a CVD process, and/or thermal oxidation to fill the shallow trench 15. This results in a semiconductor wafer 101 as illustrated in FIG. 4. Depending on its roughness, the first horizontal surface 151 may be further planarized after forming the dielectric region 8.

Figure 2:
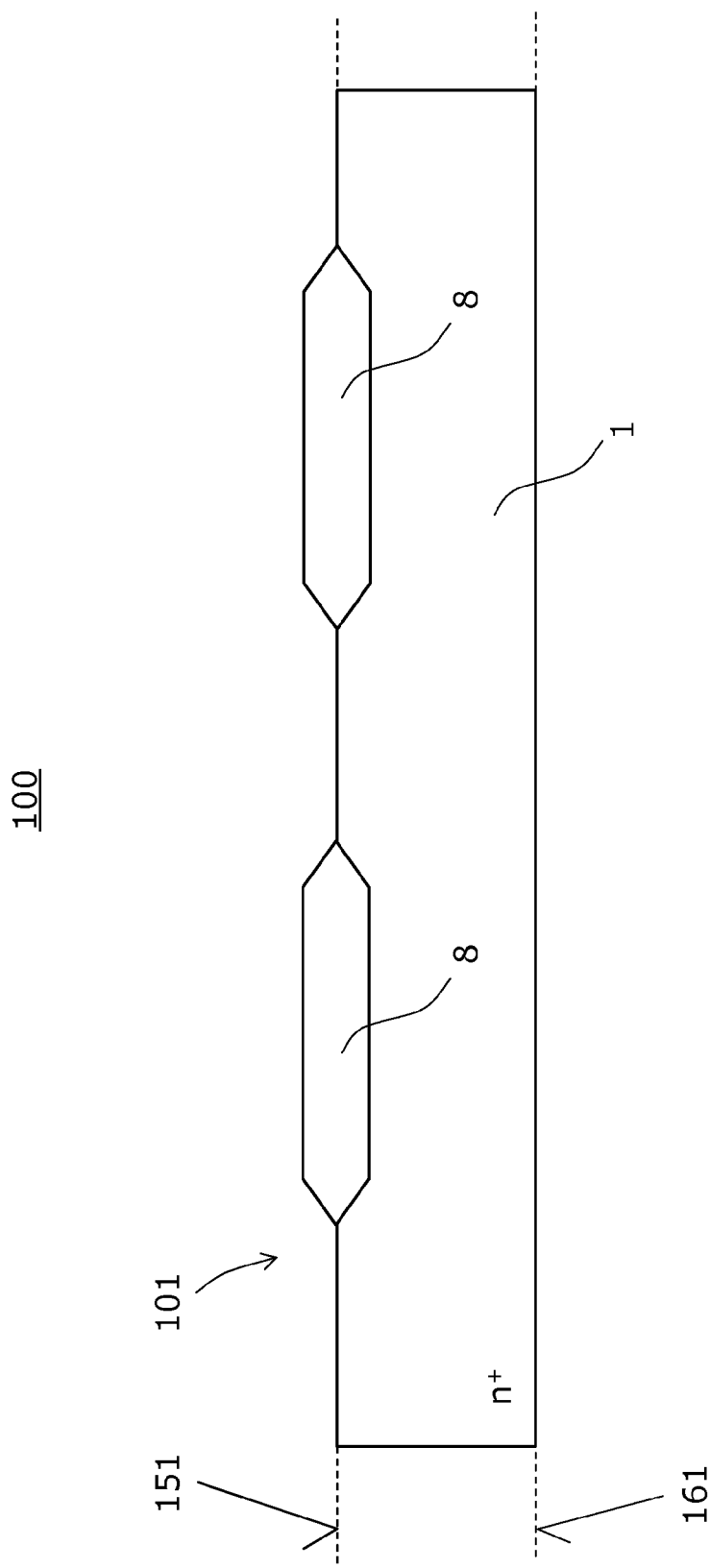
Figure 3:
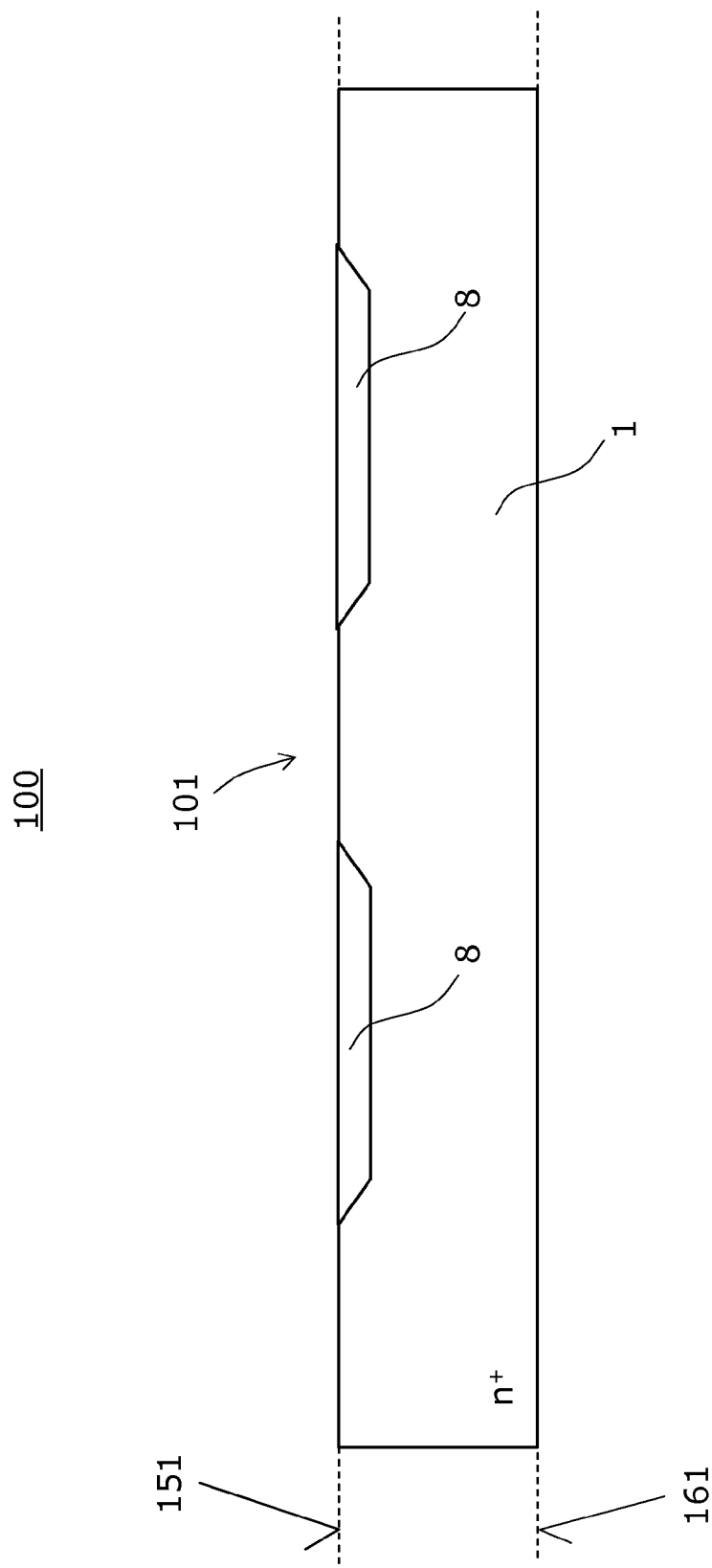

Furthermore, the dielectric region 8 may be formed by combining the processes illustrated with respect to FIG. 4, and FIGS. 2 and 3, respectively. For example, a shallow trench may be etched through a nitride mask prior to thermal growth processes for forming a LOCOS region.

Figure 5:
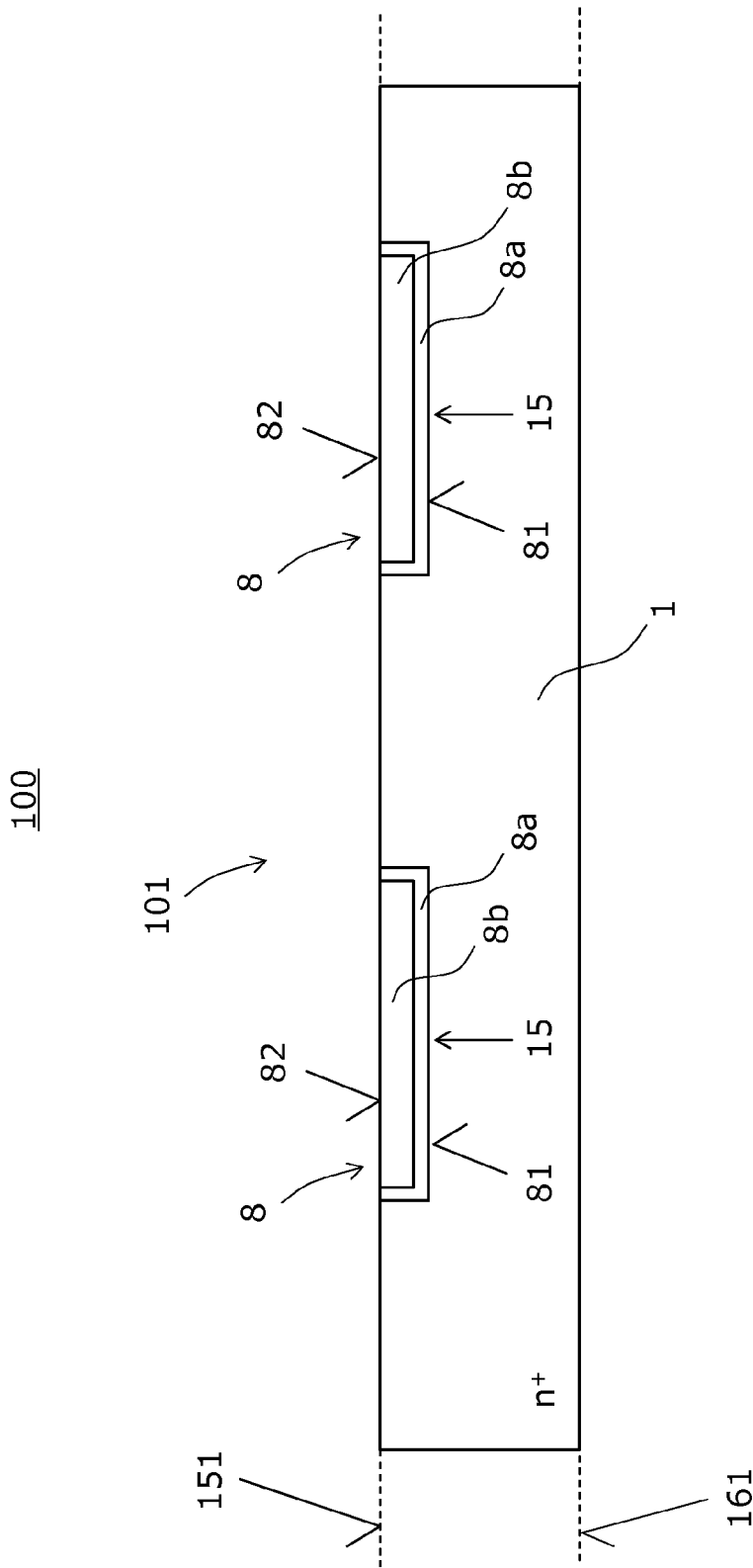

According to an embodiment, the dielectric region 8 is formed as a stack of different dielectric layers 8a and 8b as illustrated in FIG. 5. For example, a silicon nitride region 8a or siliconoxynitride region ($SiO_xN_y$) 8a may be formed on the bottom and the sidewalls of the shallow trench 15, and the residual shallow trench 15 is filled with $SiO_2$ 8b. Residual material is removed then from the first horizontal surface 151. It is, however, also possible, that the bottom of the shallow trench 15 and optionally the side walls of the shallow trench 15 are first covered with $SiO_2$, for example by thermal oxidation, and that the residual shallow trench 15 is filled with $Si_3N_4$ or $SiO_xN_y$. Dielectric region 8 may also be formed as ONO-dielectric region which includes a three layer $SiO_2$—$Si_3N_4$—$SiO_2$ stack.

The dielectric region 8 can be formed such that it has low defect density and, consequently, a high dielectric breakdown strength. The dielectric region 8 may for example have a breakdown strength of at least 1 MV/cm. Accordingly, the dielectric region 8 may later form part of a sufficiently reliable insulating region between the source and drain voltage during operation of the final device.

During manufacturing, the dielectric region 8 can form both an etch stop in a process of forming a deep vertical trench and a stop region for thinning a substrate, for example a wafer stack formed between semiconductor wafer 101 and a handling wafer. As explained in more detail below, the deep vertical trench can be etched to a first horizontal surface 81 of the dielectric region 8, and the handling wafer is typically thinned to or slightly below a second horizontal surface 82 of the dielectric region 8. The use of a stack of different dielectric regions 8a, 8b may facilitate forming the deep trench and thinning the substrate.

Furthermore, at least two laterally spaced apart dielectric regions 8 which extend equally deep into semiconductor wafer 101 may be formed as illustrated in the Figures. Each of the at least two spaced apart dielectric regions 8 can form an etch stop for forming respective deep vertical trenches. The two dielectric regions 8 which are spaced apart in the illustrated vertical cross-sections may, however, also be single connected, for example formed as a closed loop or ring.

The Figures represent only one typical cross-sectional view. Other cross-sectional views through the semiconductor devices may be similar, for example when the illustrated semiconductor regions or layers, dielectric regions or layers and metallizations are, in a direction which is perpendicular to the illustrated cross-sections, substantially bar-shaped. It is, however, also possible that at least some of the illustrated semiconductor regions or layers, dielectric regions or layers and metallizations are substantially disc-shaped or ring shaped.

Typically, the roughness of the first horizontal surface 151 and/or the step height of the first horizontal surface 151 of the semiconductor wafer 101 are below about 25 nm to facilitate wafer bonding. In addition or alternatively to the CMP-process after forming the dielectric region 8, a polycrystalline or amorphous silicon-layer may be deposited on the first horizontal surface 151 and polished to reduce the surface roughness and/or step height. Depending on the roughness of the first horizontal surface 151 after forming the dielectric region 8, the optional planarization processes may also be omitted.

Figure 6:
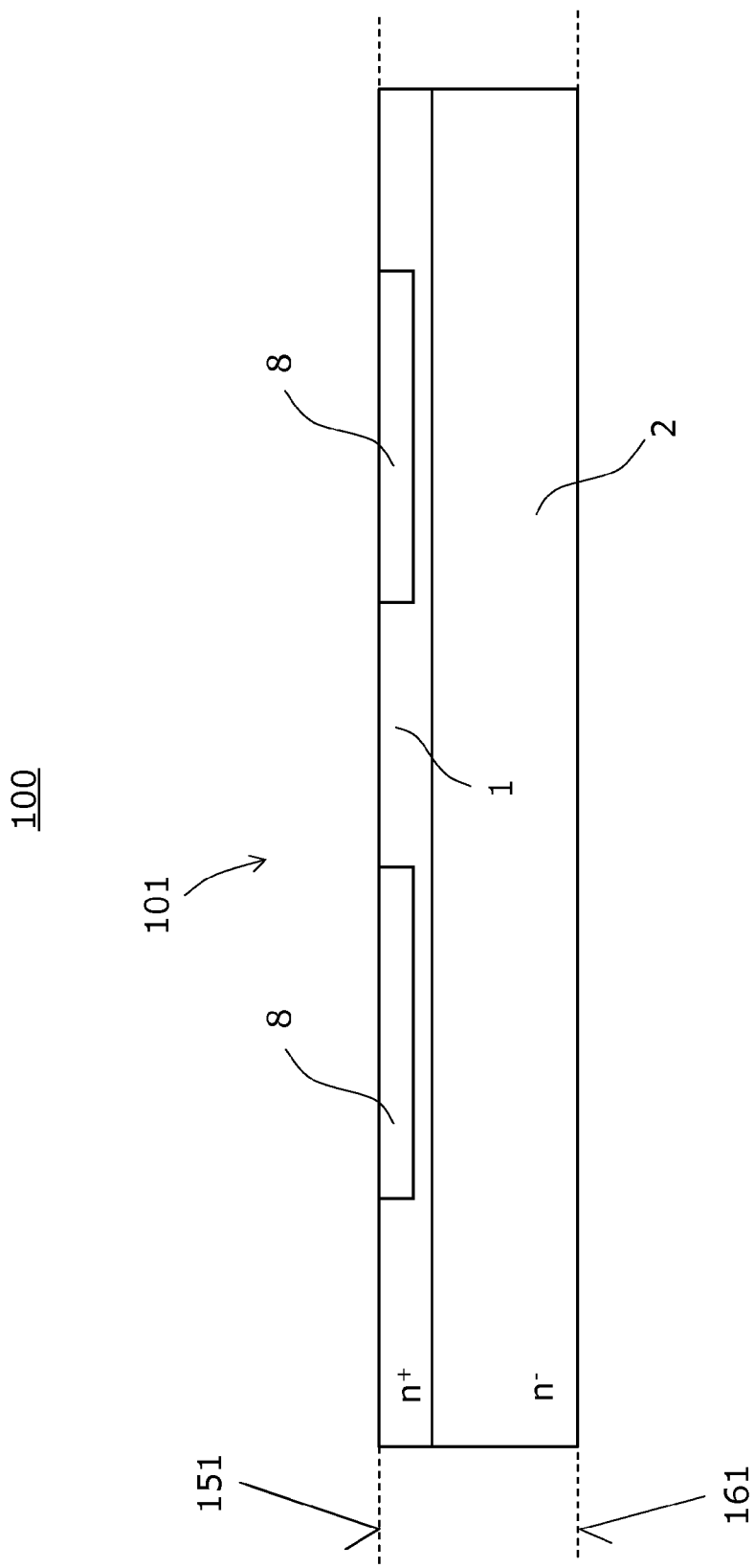
Figure 7:
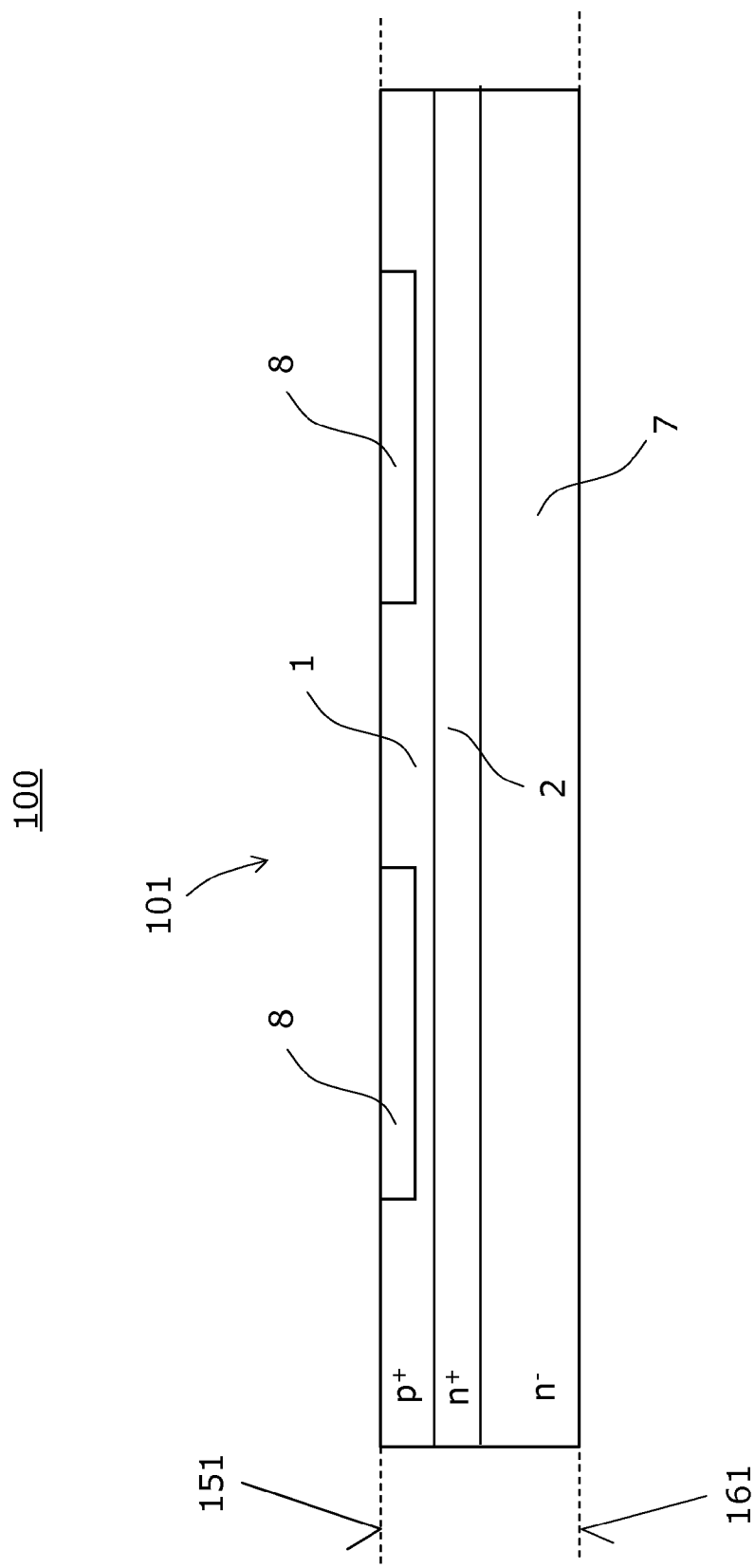
Figure 8:
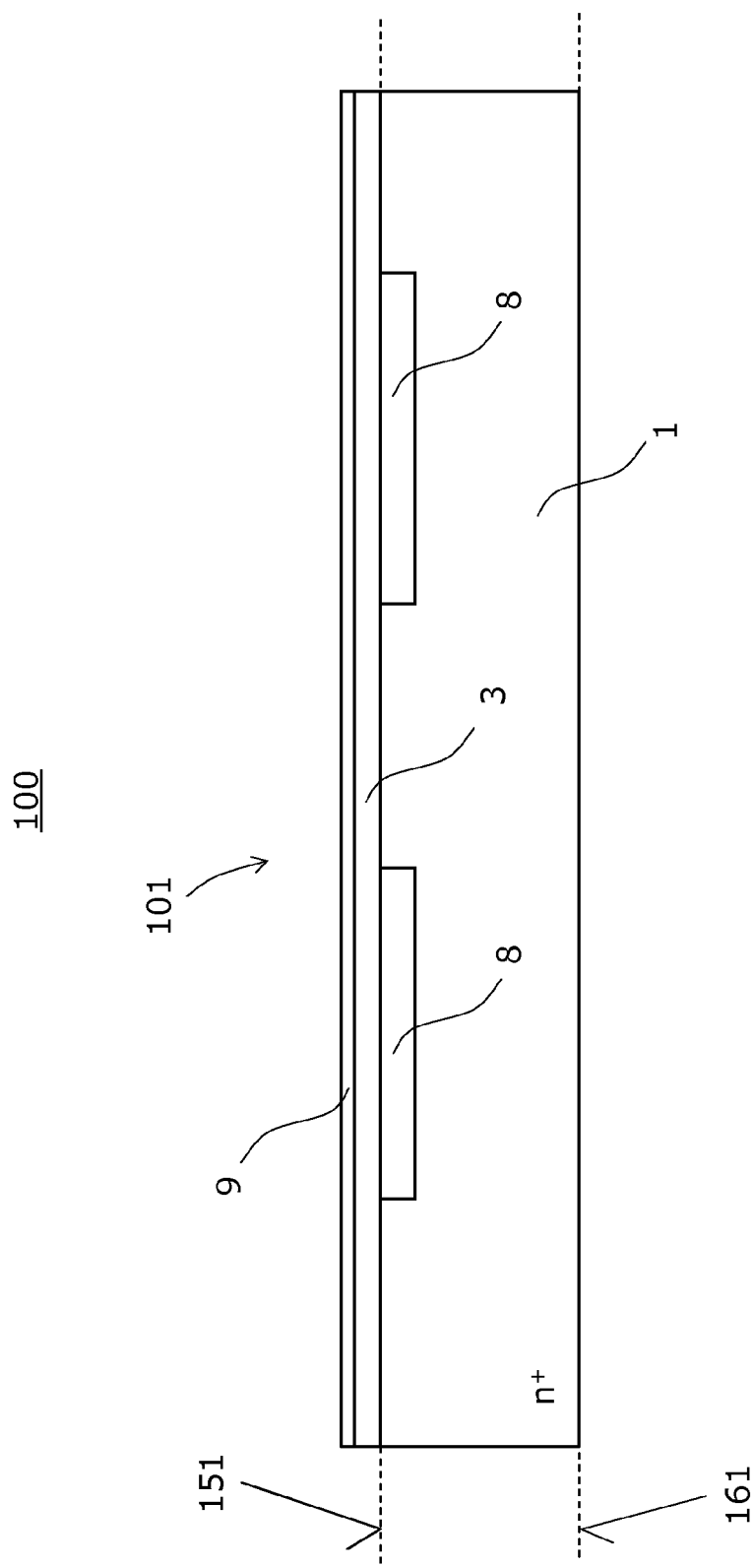

Depending on the semiconductor device to be manufactured and/or its specification, the semiconductor wafer 101 may also include two or more horizontally extending semiconductor layers as illustrated with respect to FIGS. 6 and 7. For example, the dielectric region 8 may be formed in an $n^+$-type first semiconductor layer 1 arranged on an $n^-$-type second semiconductor layer 2 a part of which may later form a portion of a drift region. This semiconductor structure is illustrated in FIG. 6.

The dielectric region 8 may also be formed in a $p^+$-type first semiconductor layer 1 arranged on an $n^+$-type second semiconductor layer 2 which is arranged on an $n^-$-type the third semiconductor layer 7. This semiconductor structure is illustrated in FIG. 7 and may be used to manufacture an IGBT. The first semiconductor layer 1 and the second semiconductor layer 2 may be formed by implanting and annealing before or after forming of the dielectric region 8. Alternatively, the first semiconductor layer 1 and the second semiconductor layer 2 are formed by epitaxy prior to forming the dielectric region 8.

Thereafter, a thin silicon oxide layer 9 can be formed on the first horizontal surface 151 to facilitate wafer-bonding. In the exemplary embodiment illustrated in FIG. 8, the thin silicon oxide layer 9 is formed on an optional poly-silicon layer 3. The optional poly-silicon layer 3 is formed on the first horizontal surface 151 and can be polished to further reduce surface roughness.

Figure 9:
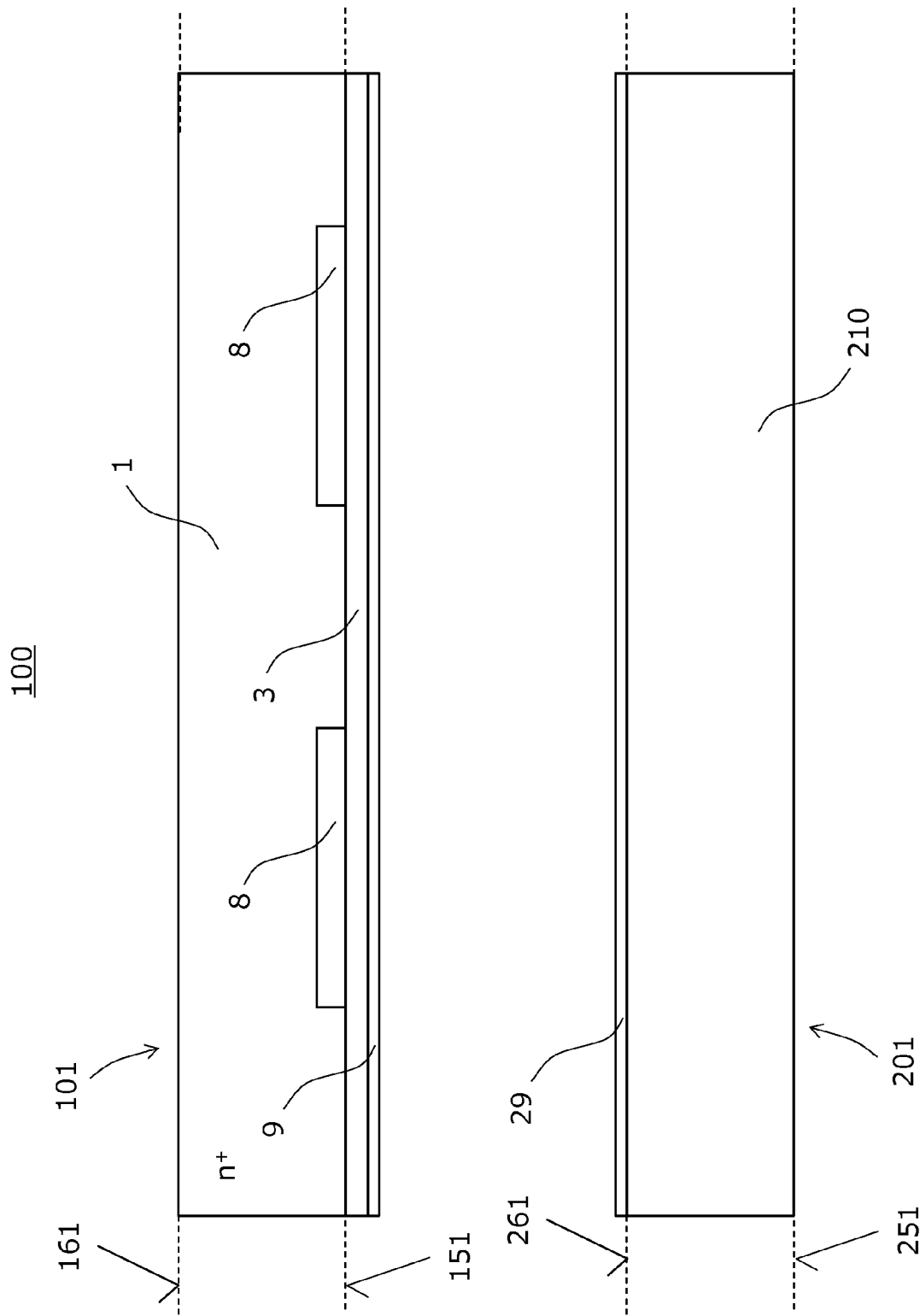

Referring to FIG. 9, a second semiconductor wafer 201 forming a handling wafer 201 is provided. The second wafer 201 may have a semiconductor layer 210 which extends between a second horizontal surface 261 and an opposite surface 251 of the second wafer 201. A second thin silicon oxide layer 29 can be formed on to the second horizontal surface 261 to facilitate oxide-to-oxide wafer-bonding. As illustrated in FIG. 9, the first semiconductor wafer 101 can be flipped or turned upside down so that the first horizontal surface 151 of the first semiconductor wafer 101 and the second horizontal surface 261 of the second semiconductor wafer 201 are arranged face-to-face. The handling wafer 201 may include the same semiconductor material as the first wafer. It may alternatively include a different material such as a different semiconductor material. The handling wafer 201 may also be an insulating wafer such as glass or even a metallic wafer.

Figure 10:
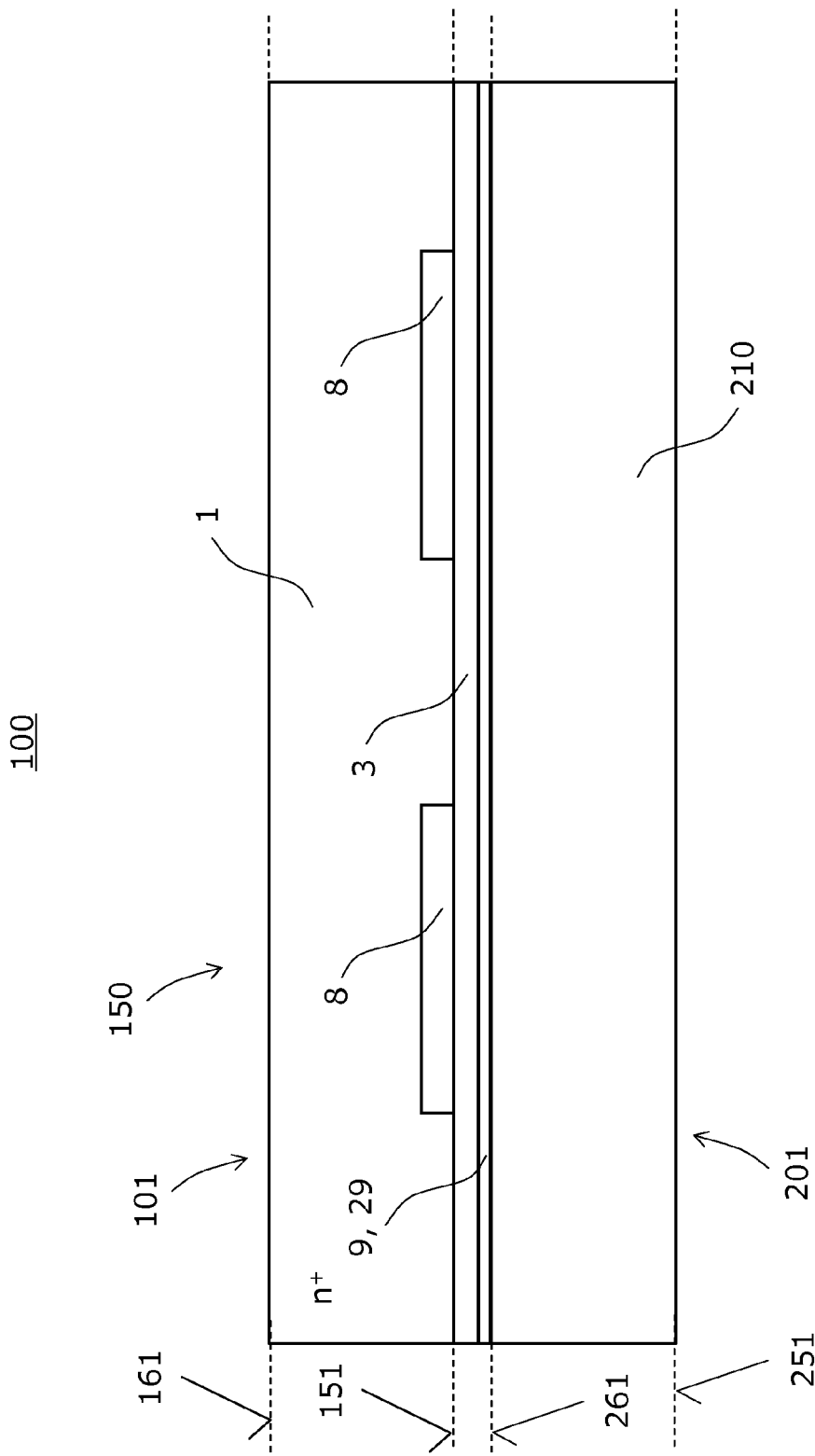

Thereafter, a wafer stack 150 is formed by wafer bonding, typically by oxide-to-oxide bonding, of the first semiconductor wafer 101 and the second semiconductor wafer 201 so that the dielectric region 8 is completely embedded in the wafer stack 150. This is illustrated in FIG. 10.

In other embodiments, a horizontal extension of the second semiconductor wafer 201 is smaller than a horizontal extension of the first semiconductor wafer 101 and wafer-bonded to the first semiconductor wafer 101 so that the dielectric region 8 is only partly embedded in the wafer stack.

At least one of the first thin silicon oxide layer 9 and the second thin silicon oxide layer 29 is only optional for wafer bonding. For example, the second semiconductor wafer 201 may be provided without the second thin silicon oxide layer 29. Accordingly, the wafer stack 150 may be formed by anodic bonding the first thin silicon oxide layer 9 to the semiconductor layer 210 of the second semiconductor wafer 201.

After wafer-bonding, the first semiconductor wafer 101 of wafer stack 150 may be suitably thinned, for example in a further mechanical polishing process, CMP-process or an etching process or a combination of such processes.

Figure 11:
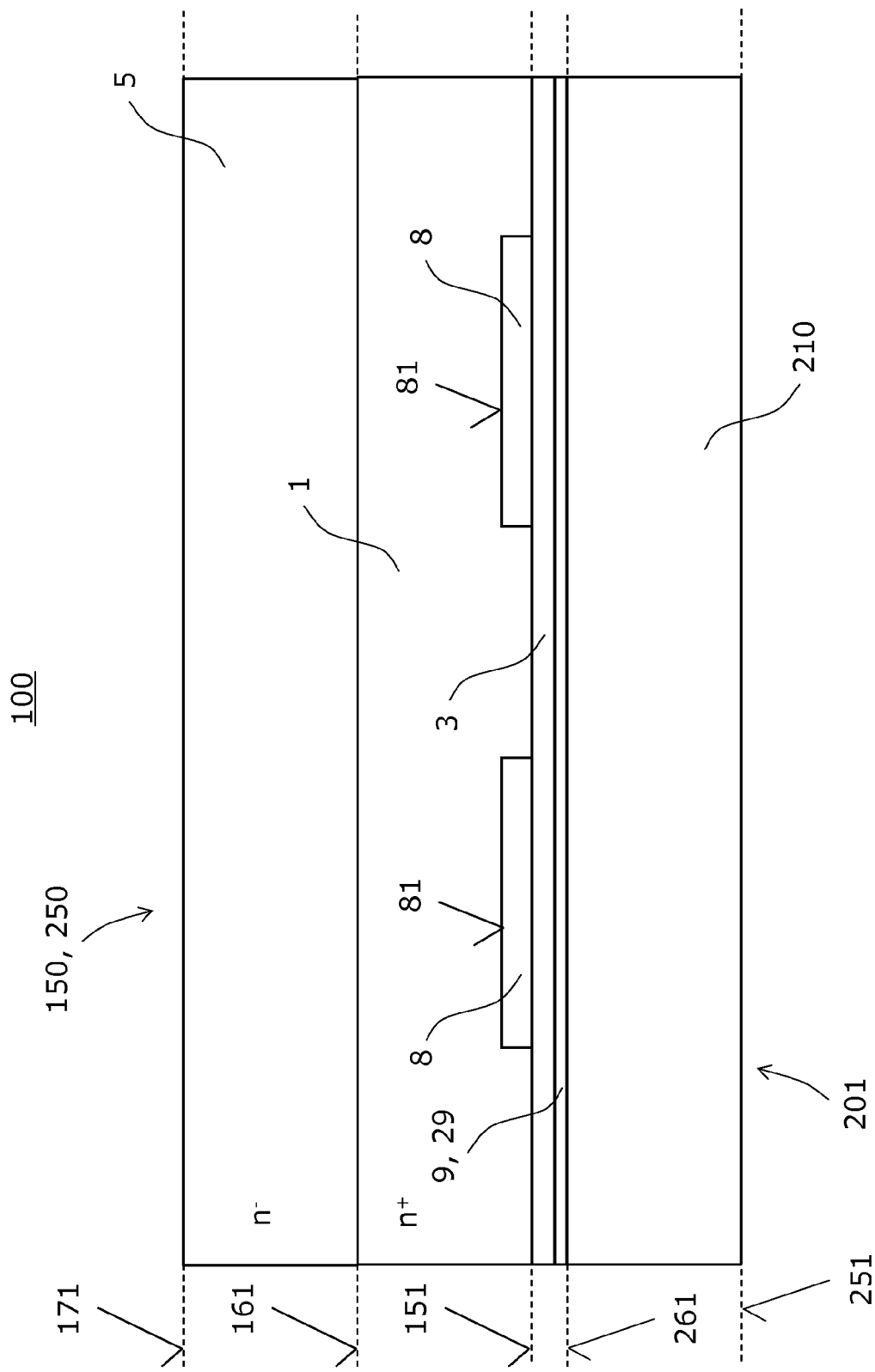

Thereafter, an epitaxial layer 5, typically of the first conductivity type ($n^-$-type), may be formed on the first semiconductor wafer 101 of the wafer stack 150. The resulting semiconductor substrate 250 formed by the wafer stack 150 and the epitaxial layer 5 arranged on the first semiconductor wafer 101 of the wafer stack 150 is illustrated in FIG. 11. Semiconductor substrate 250 has a main horizontal surface 171 and an opposite surface 251. The main horizontal surface 171 may be formed by the opposite surface of the first semiconductor wafer 101 or, as illustrated in FIG. 11, by a surface of the epitaxial layer 5. The opposite surface 251 of the semiconductor substrate 250 can be formed by the opposite surface of the second semiconductor wafer 201 of wafer stack 150.

The process of forming an epitaxial layer 5 may be also be omitted, when the first semiconductor wafer 101 already includes a further semiconductor layer as illustrated in FIG. 6. In this embodiment, the main horizontal surface of the semiconductor substrate 250 can be formed by the first horizontal surface 161 of the first semiconductor wafer 101.

The processes explained with respect to FIGS. 1 to 11 may also be described as a single process of providing a semiconductor substrate 250 with a main horizontal surface 171, an opposite surface 251, and a dielectric region 8 which is arranged in the semiconductor substrate 250 and spaced apart from the main horizontal surface 251 and the opposite surface 251. In the following, the dielectric region 8 is also referred to as buried dielectric region.

Alternatively, a similar semiconductor substrate as illustrated in FIG. 11 may be formed when the dielectric region 8 is formed at the second horizontal surface 261 of the second semiconductor wafer 201 prior to wafer bonding. Furthermore, respective dielectric regions 8 may be formed at the first horizontal surface 151 of the first semiconductor wafer 101 and at the second horizontal surface 261 of the second semiconductor wafer 201 prior to wafer bonding.

Figure 12:
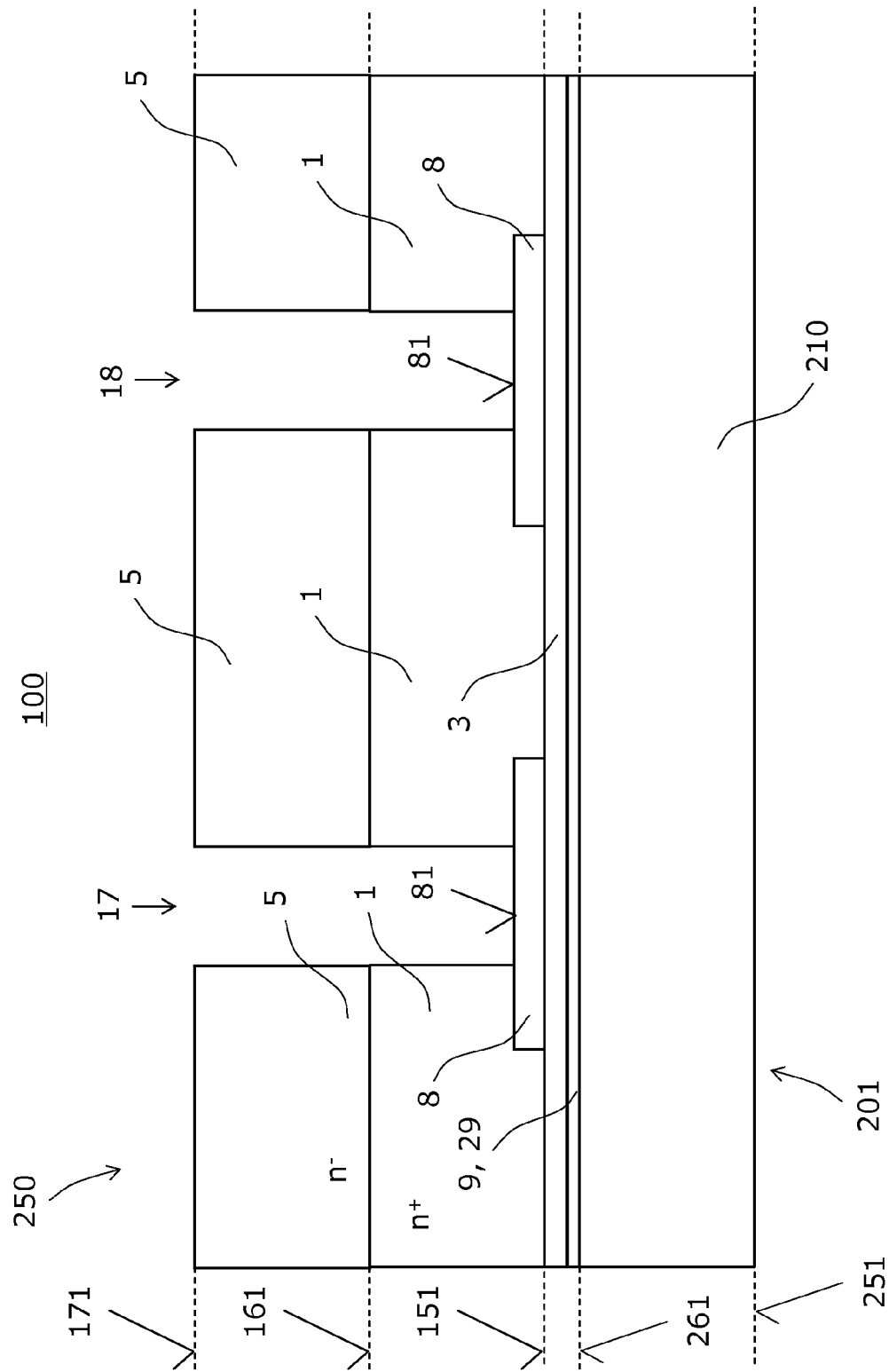

Referring to FIG. 12, one or more deep vertical trenches 17, 18 are etched in the semiconductor substrate 250 from and/or through the main horizontal surface 171 using the dielectric region 8 as an etch stop. Thereby, the deep vertical trenches 17, 18 are etched to the first horizontal surfaces 81 of the respective dielectric region 8. The one or more deep vertical trenches 17, 18 may vertically extend several μm up to about 10 μm or up to about 50 μm or up to about 150 μm into the semiconductor substrate 250. The deep vertical trenches 17, 18 can generally extend in the vertical direction. However, the deep vertical trenches 17, 18 may also be inclined relative to the main horizontal surface 171, so that an angle between side walls of the trenches 17, 18 and the main horizontal surface 171 may be different from 90°. Furthermore, the trench width may decrease or may increase with depth. Furthermore, the side walls of a deep vertical trench 17, 18 may also be tilted toward the same direction with the trench width being e.g. constant over the trench depth. Further, the direction in which the deep vertical trenches 17, 18 are tilted may, for example, vary over the semiconductor substrate 250.

Thereafter, the side walls of the deep vertical trenches 17, 18 can be insulated. In the exemplary embodiment illustrated in FIG. 13, the side walls of both deep vertical trenches 17, 18 are insulated with the same dielectric material, typically with $SiO_2$ forming respective insulating layers 21. The insulating layers 21 may be formed by thermal oxidation or by a CVD process. Instead of an oxide, any other type of insulation or dielectric material may be used for forming the insulating layers 21, like a nitride, aluminum oxide ($Al_2O_3$) or a low-k-dielectric. Furthermore, the insulation layers 21 may be formed as composite layers which include two or more layers of an insulation material arranged one above the other.

According to an embodiment, the deep vertical trenches 17, 18 are etched only close to the first horizontal surfaces 81 of the respective dielectric regions 8. The remaining semiconductor material on the first horizontal surfaces 81 of the respective dielectric regions 8 may be oxidized by thermal oxidation, for example during forming of the insulating layers 21.

According to an embodiment, a trench etch mask, for example a $Si_3N_4$ or an oxide mask, used for etching the deep vertical trenches 17, 18 is also used as mask for forming the insulating layers 21 and removed only thereafter.

According to an embodiment, the insulating layers 21 are arranged on the side walls of the deep vertical trenches 17, 18 and adjoin a respective insulating region 8. For example, the insulating regions 8 and the insulating layers 21 are formed by thermal oxidation so that a very good electrical insulation of the trench interior from the adjoining semiconductor regions 1, 5 is provided. Thereby, the interior of the deep vertical trenches may be on a different potential than the adjoining semiconductor regions 1, 5 during operation of the final semiconductor device. Furthermore, different portions of the semiconductor regions 1, 5 which are separated from each other by the deep vertical trenches 17, 18 may be on different potential during operation of the final semiconductor device.

Thereafter, the deep vertical trenches 17, 18 are typically filled. In the exemplary embodiment illustrated in FIG. 14, the left deep vertical trench 17 is filled with a first material 22 and the right deep vertical trench 18 is filled with a second material 23.

According to an embodiment, the second filling material 23 is an electrically conductive material, like a doped amorphous or polycrystalline semiconductor material, such as polysilicon (poly-Si), a metal, for example Cu, a silicide or carbon or a stack of these materials. The second filling material 23 in the right deep vertical trench 18 later forms a conductive plug of a via region for connecting control electrodes to a control metallization, for example a gate metallization.

The first filling material 22 is typically an insulating material, so that the deep vertical trench 17 is completely filled with an insulation material. The deep vertical trench 17 may, however, also include voids. The first and second filling materials 22, 23 are typically also deposited on the main horizontal surface 171, for example on the trench etch mask. After filling the deep vertical trenches 17, 18, the portions of the first and second filling materials 22, 23 deposited on the main horizontal surface 171, the trench etch mask and any residual layers of additional masks for masking one of the deep vertical trenches 17, 18 during filling the other deep vertical trench 17, 18 are typically removed from the main horizontal surface 171.

In other embodiments, both deep vertical trenches 17, 18 are filled with the same filling material, for example with a conductive filling material.

Thereafter, a first doped region 4, typically of the second conductivity type (p-type), is formed in the semiconductor substrate 250 next to the main horizontal surface 171. In the exemplary embodiment illustrated in FIG. 15, the first doped region 4 is formed in an active area of the semiconductor substrate 250. Furthermore, second doped regions 70 of the first conductivity type are typically formed in the first doped region 4. The first and second doped regions 4, 70 may be formed by implantation of suitable dopants and subsequent activation or drive-in processes. The first doped region 4 and portions of the second doped regions 70 typically form a body region and source regions, respectively, of a vertical transistor structure 120.

Thereafter, shallow vertical trenches 19, 19a may be formed from the main horizontal surface 171, through the first and second doped regions 4, 20 and at least partially into an adjoining portion 5a of the epitaxial layer 5. The portion 5a of the epitaxial layer 5 caaan forms a drift region of the vertical transistor structure 120. In the following, the portion 5a is also referred to a fourth doped region.

Thereafter, the shallow trenches 19, 19a can be insulated, for example with $SiO_2$ to form gate dielectric regions 62. The gate dielectric regions 62 may be formed by thermal oxidation or by deposition also using a mask for etching the shallow trenches 19, 19a as mask. Furthermore, the gate dielectric regions 62 may be formed as stacked dielectric layers, for example as ONO-layers. Further, the gate dielectric regions 62 can be suitably thickened at the bottom of the shallow trenches 19, 19a.

Thereafter, the shallow trenches 19, 19a may be filled with a conductive material, for example highly doped poly-Si to form gate electrodes 61 of the vertical transistor structure 120. This may be achieved by deposition and back etching of poly-Si using an optional etching mask for the back etching of the deposited poly-Si to define planar poly contact regions on a thin thermal oxidation layer (not shown) on the main horizontal surface 171 which may have been formed during thermal oxidation for forming the gate dielectric regions 62. Alternatively, a further CMP-process may be used after depositing of poly-Si. The resulting semiconductor substrate 250 is illustrated in FIG. 16 after removing any masks for forming the shallow trenches 19, 19a and the first and second doped regions 4, 70.

The first and second doped regions 4, 20 may also be formed after forming the shallow trenches 19, 19a and the gate dielectric regions 62. The thin thermal oxidation layer typically remains on the main horizontal surface 171 during forming the first and second doped regions 4, 20 by implantation and drive-in processes and/or during forming the gate electrodes 61. Later, the thin thermal oxidation layer on the first and second doped regions 4, is at least partly removed to expose the first and second doped regions 4, 20 for later contacting.

Figure 16:
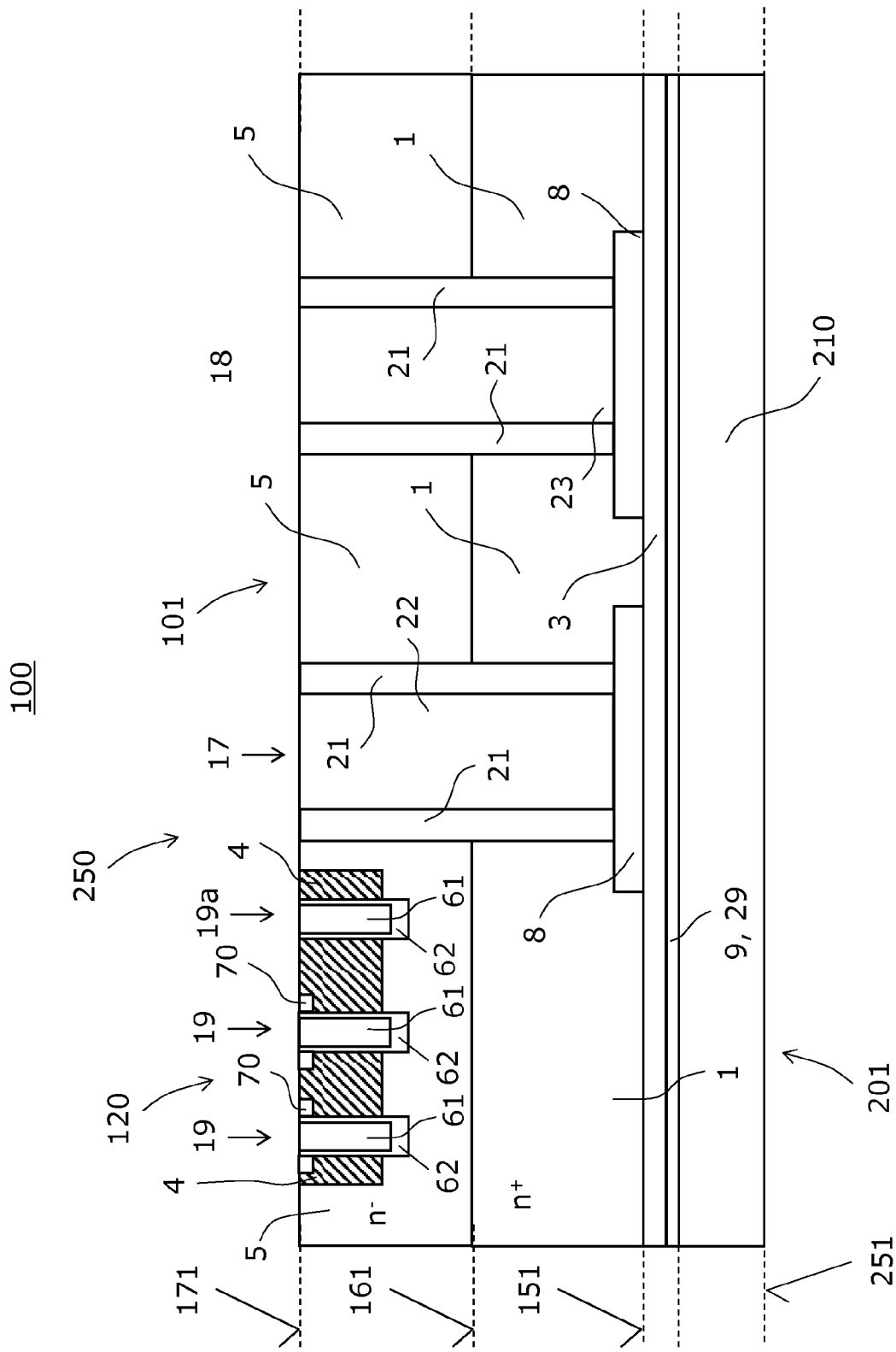

In the illustrated vertical cross-section of FIG. 16, the most right shallow trench 19a does not adjoin a second doped region. This is because a gate wiring to the gate electrode 61 in this shallow trench 19a is later formed in this cross-section as explained in more detail with reference to FIG. 18. However, the shallow vertical trenches 19, 19a typically extend into a direction which is perpendicular to the illustrated vertical cross-section of FIG. 16. In another vertical cross-section, the shallow trench 19a typically also adjoins respective second doped regions. Accordingly, the gate electrode 61 in the most right shallow trench 19a may also be operated as a control electrode of the vertical transistor structure 120. The gate electrodes 61 and the adjoining gate dielectric regions 62, i.e. the insulated gate electrodes 61, 62, form a control structure of the vertical transistor structure 120. The vertical transistor structure 120 may include one or, as illustrated in FIG. 16, several vertical field effect transistors, for example for power applications. Accordingly, the illustrated cross-sections of the Figures typically correspond only to a representative section.

Figure 17:
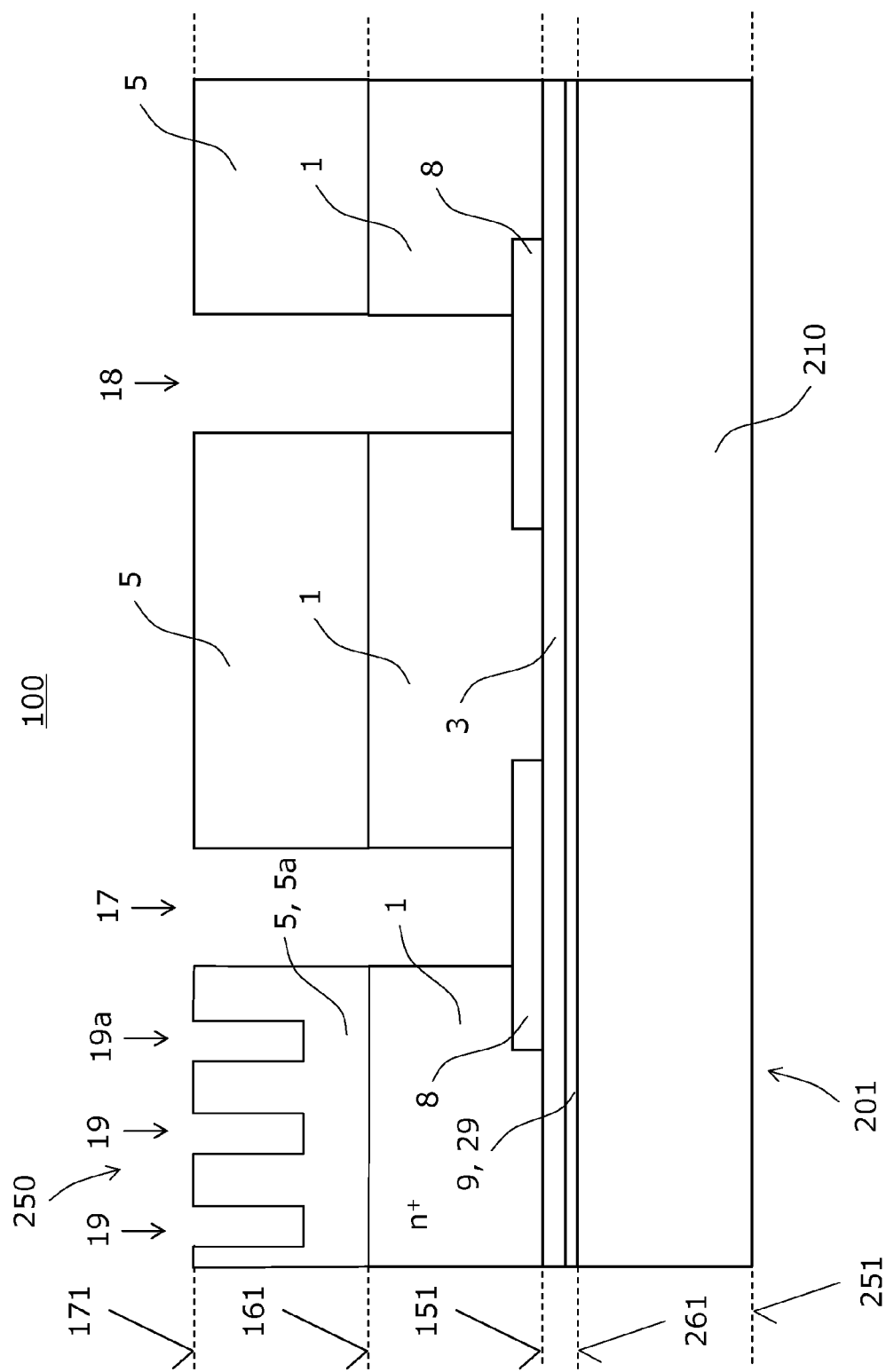

According to an embodiment, a similar semiconductor substrate as illustrated in FIG. 16 may be obtained from the semiconductor substrate 250 illustrated in FIG. 11 by another process sequence. In this embodiment, the deep vertical trenches 17, 18 and the shallow trenches 19, 19a can be formed in common etching processes using a common trench etch mask and the dielectric regions 8 as etch stop for the deep vertical trenches 17, 18. The common trench etch mask exposes smaller areas of the semiconductor substrate 250 for the shallow trenches compared to exposed areas of the semiconductor substrate 250 for forming the deep vertical trenches 17, 18. This embodiment employs the fact that below a broader opening of the common etching mask a broader and vertically deeper trench is formed by etching. The resulting semiconductor substrate is illustrated in FIG. 17.

Figure 13:
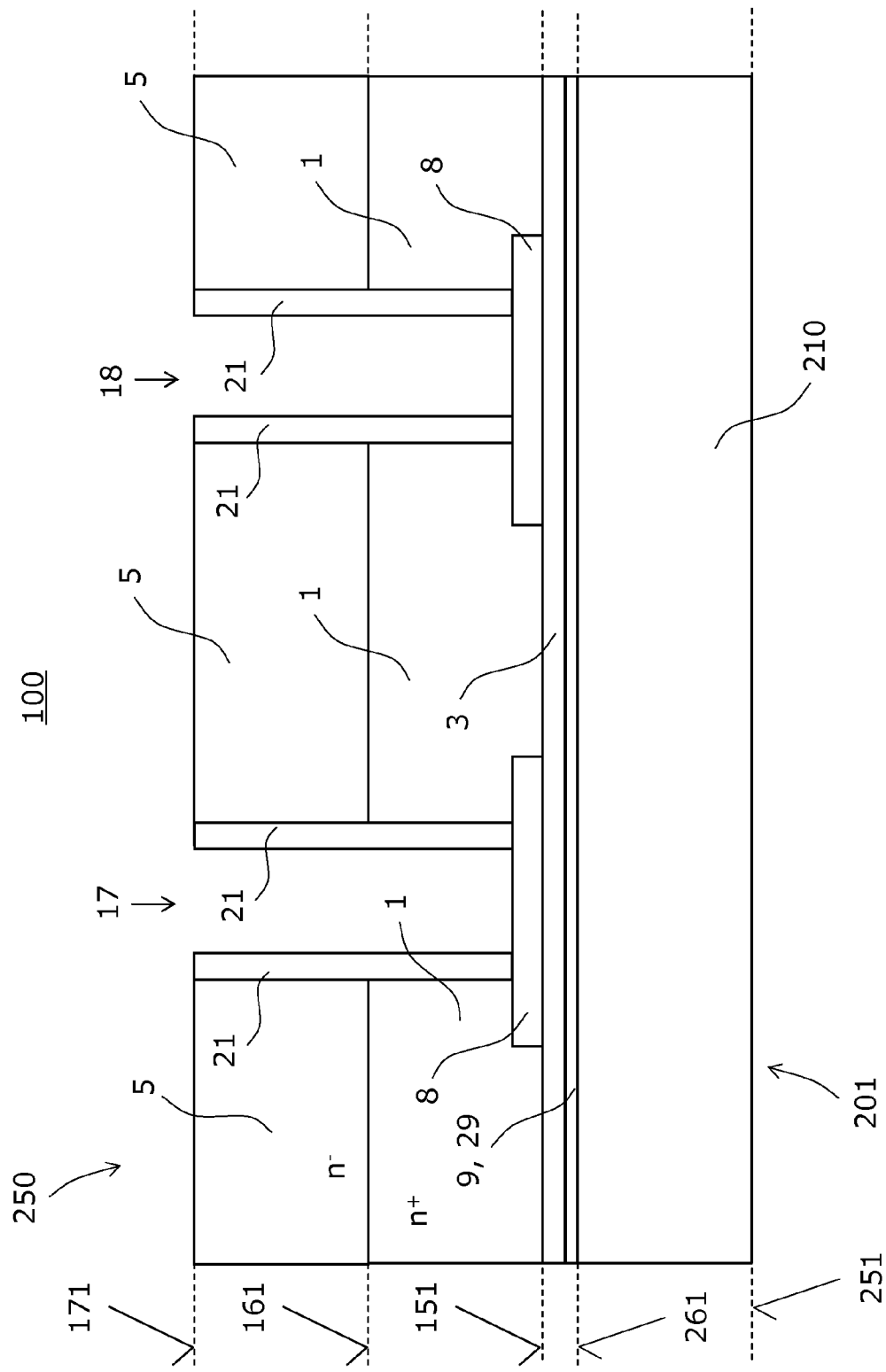
Figure 14:
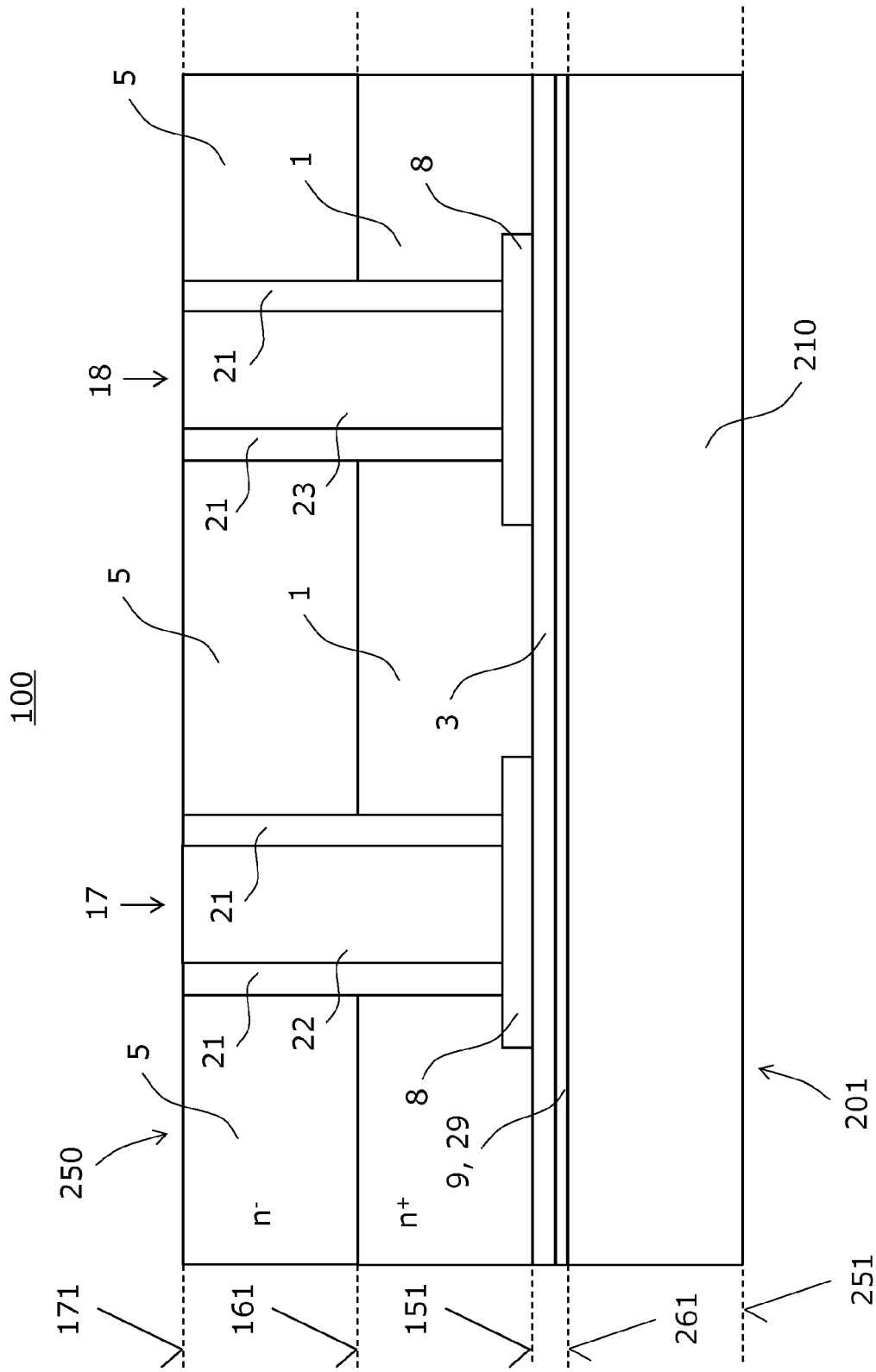
Figure 15:
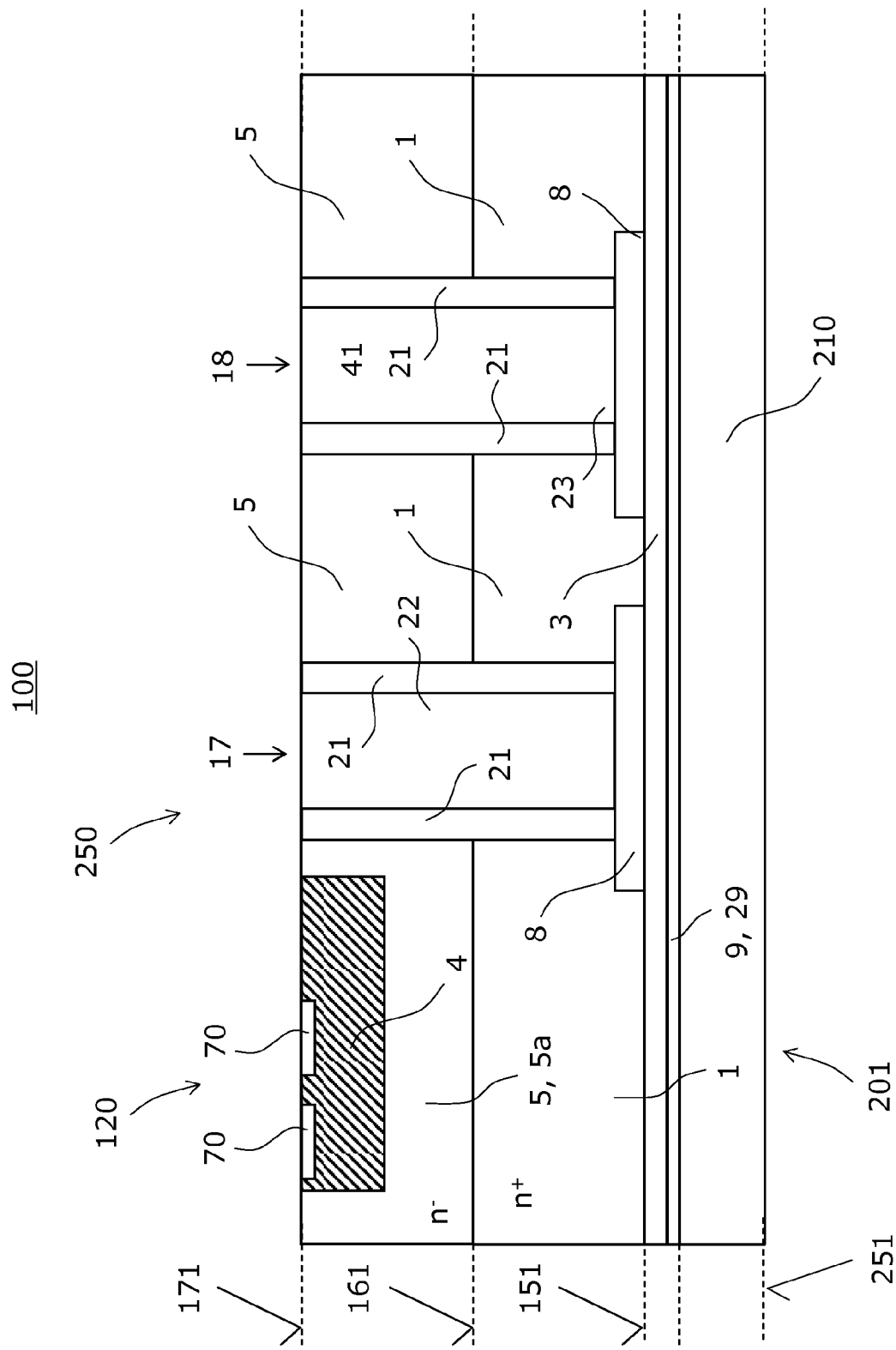

Thereafter, the side walls of the deep vertical trenches 17, 18 are insulated and the residual deep vertical trenches 17, 18 filled as explained with reference to FIGS. 13 and 14. Further, first and second doped regions 4, 70 may be formed, for example by suitable implantations, and insulated gate electrodes 61, 62 may be formed as explained with reference to FIG. 16.

Figure 18:
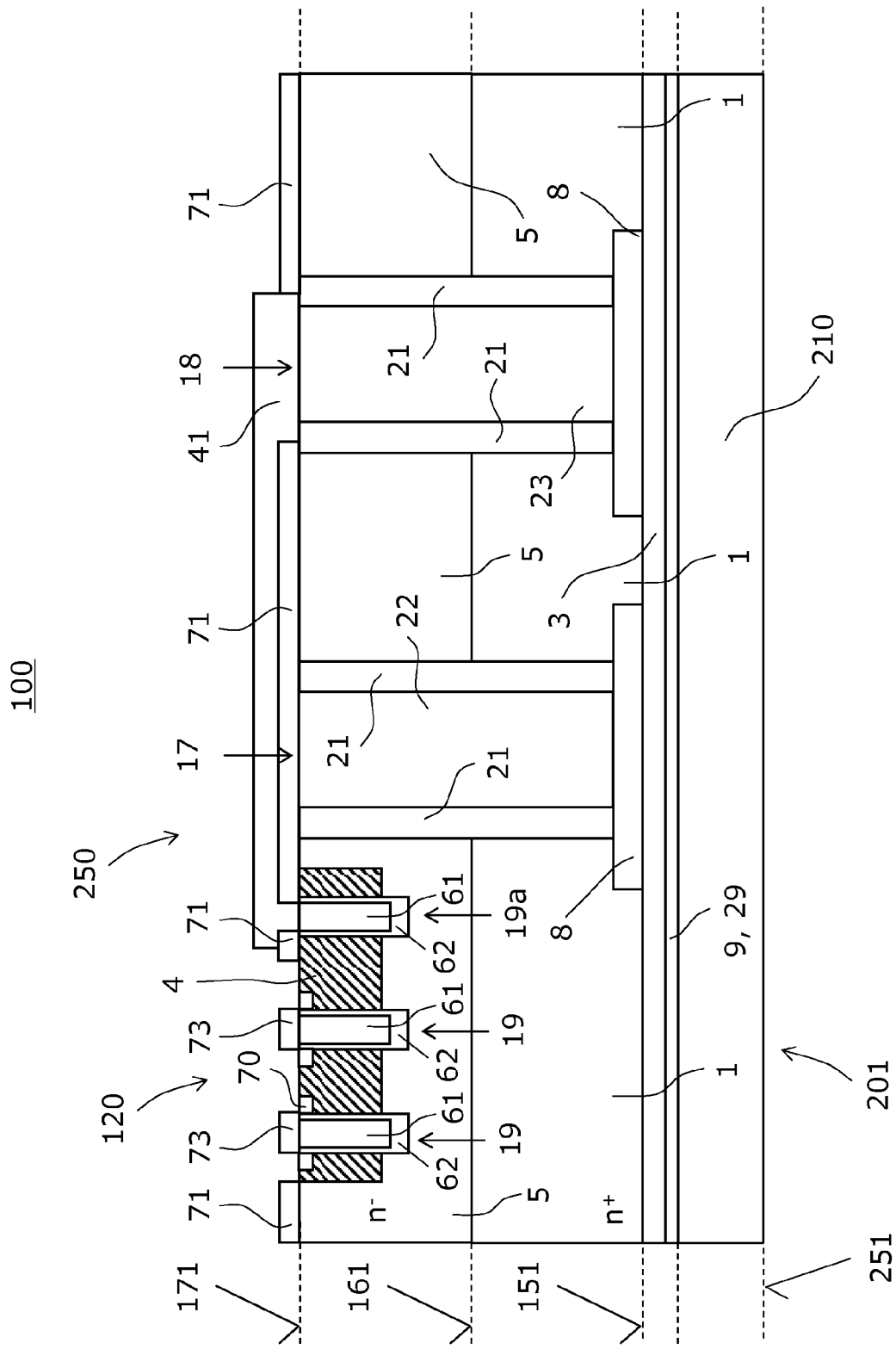

Referring to FIG. 18, a control wiring 41 is formed on main horizontal surface 171 to form a low ohmic contact between the gate electrodes 61 and the conductive second filling material 23 forming a conductive plug. A structured insulating layer 71 and dielectric plugs 73, which are for example made of an oxide, and a conductive gate wiring layer 41 can be formed on the main horizontal surface 171 so that only the first doped region 1 and the second doped regions 70 are exposed. The dielectric plugs 73 cover the gate electrodes 62 in the shallow trenches 19.

For example, a silicon oxide layer may be disposed on the main horizontal surface 171. Thereafter, the silicon oxide layer is structured so that, in the illustrated vertical cross-section, only the gate electrode 61 in shallow trench 19a and the conductive plug 23 are exposed. This is typically followed by forming the gate wiring layer 41 to connect the gate electrode 61 in the shallow trench 19a and the conductive plug 23, for example by depositing and masked back-etching of poly-Si or a metal such as copper or tungsten on a thin barrier. Thereafter, the silicon oxide layer may be structured so that the second doped regions 70 and the portions of the first doped region 4 adjoining the shallow trenches 19 are exposed. The gate electrodes 61 in the vertical trenches 19 can be connected in parallel to the conductive plug 23 in different vertical cross-sections.

According to an embodiment, a similar semiconductor substrate as illustrated in FIG. 18 but without the dielectric plugs 73 may be obtained by another process sequence from the semiconductor substrate 250 illustrated in FIG. 16 but without the gate electrodes. In this embodiment, a thin thermal oxidation layer (not shown in FIG. 16) has been formed on the main horizontal surface 171 during a thermal oxidation process for forming the gate dielectric regions 62. Portions of the thin thermal oxidation layer on the main horizontal surface 171 are thickened, for example by a further thermal growth process, to form an insulating layer 71. A conductive material such as poly-Si is deposited on the main horizontal surface 171. Thereafter, the deposited conductive material is partially etched back to form the gate electrodes 61 and the gate wiring 41. In this embodiment, the gate electrodes 61 and the gate wiring 41 are formed in parallel. Thereafter, the second doped regions 70 and the portions of the first doped region 4 which adjoin the shallow trenches 19 can be exposed.

Figure 19:
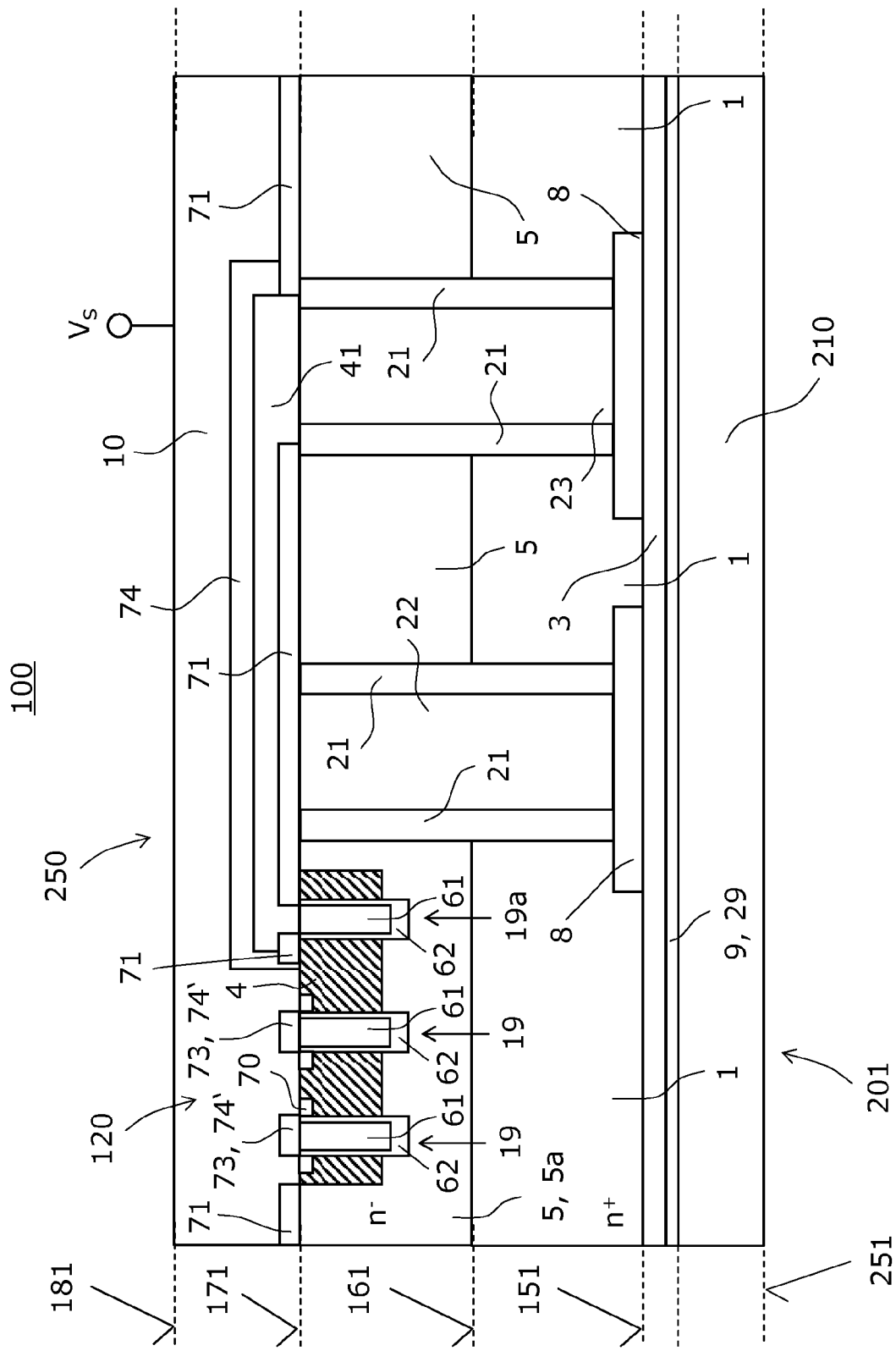

Referring to FIG. 19, a first metallization 10 is formed on the main horizontal surface 171 so that the first metallization 10 is in ohmic contact with the first doped region 4 and the second doped regions 70 of the transistor structure 120 and insulated from the gate wiring 41. Accordingly, a further insulating layer 74 is formed on the gate wiring 41 prior to forming the first metallization 10. The further insulting layer 74 may, for example, be formed by deposition and masked back etching of a dielectric material such as $SiO_2$, SiN or $SiO_xN_y$. In embodiments in which the dielectric plugs 73 have not been formed in the preceding processes, insulating portions 74' can be formed on the gate electrodes 62 in the vertical trenches 19 by forming the further insulting layer 74. In these embodiments, the portions 74' form dielectric plugs 73.

The first metallization 10 can completely covers the semiconductor substrate 250 on the main horizontal surface 171. The first metallization 10 may be formed by a deposition and an optional planarization process so that the first metallization 10 extends to a sufficiently planar top surface 181 above the main horizontal surface 171. The top surface 181 typically forms later a backside of the finished semiconductor device 100. The finished semiconductor device 100 may be mounted with the top surface 181 to a simple lead frame, i.e. to a non segmented part of a lead frame. Processing of the backside of the semiconductor device 100 is typically finished by forming the first metallization 10.

Thereafter, the semiconductor substrate 250 can be mounted with the top surface 181 to a holder 190 or a tape for thinning the semiconductor substrate 250 on the opposite surface 251.

According to an embodiment, the opposite surface 251 is processed to thin the semiconductor substrate wherein the dielectric region 8 is used as stop region. Thereby, the second wafer 201 is typically removed and a thickness—which corresponds to a vertical dimension of the semiconductor substrate 250—is reduced. Accordingly, a back surface 151 of the semiconductor substrate 250 is formed.

Figure 20:
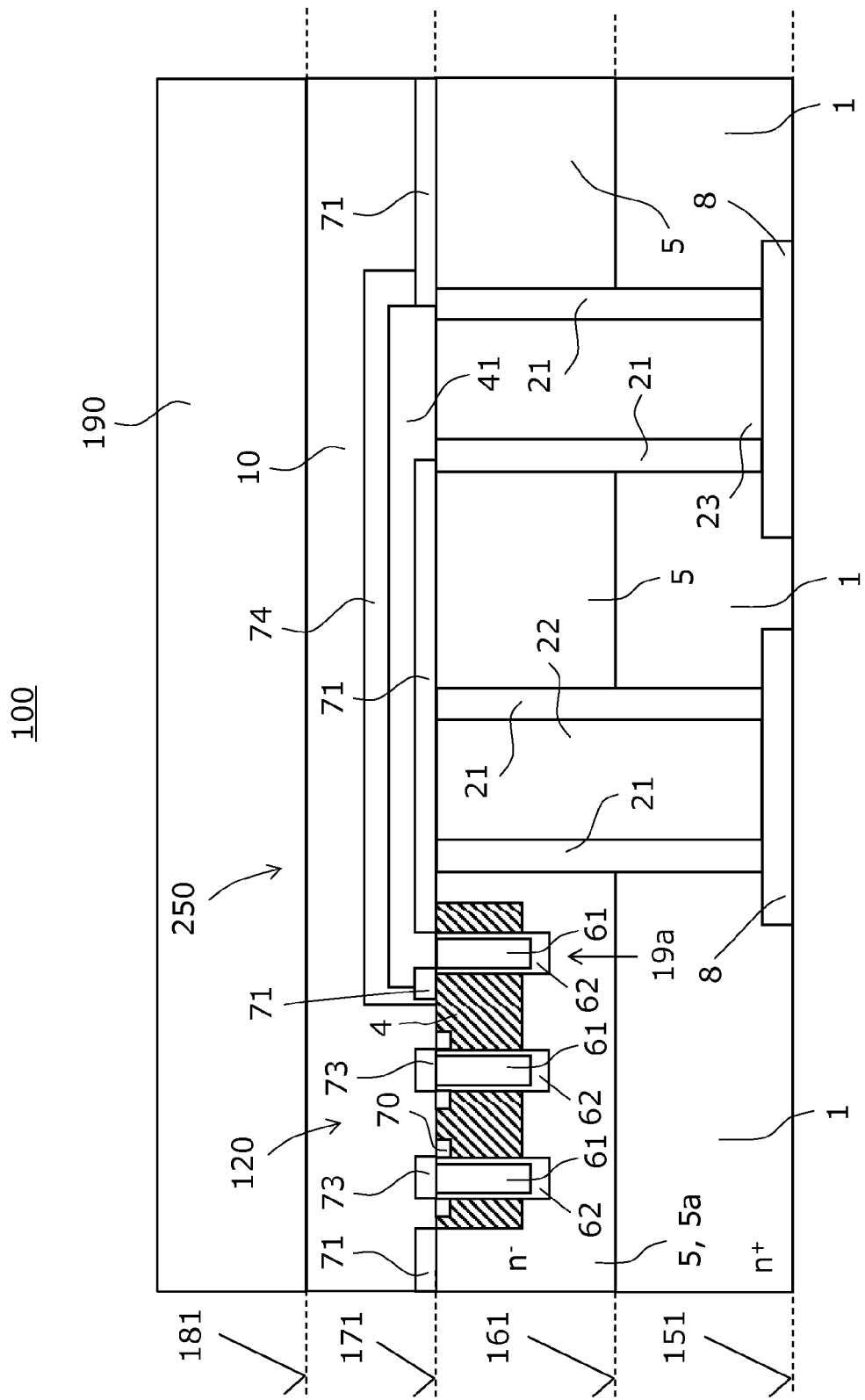

In the exemplary embodiment illustrated in FIG. 20, the back surface 151 of the semiconductor substrate 250 is formed by the first horizontal surface 151 of the first semiconductor wafer. This is typically not the case when an interface of different dielectric layers of the dielectric region 8 is used as stop region. For example, dielectric region 8 may be formed as an ONO-stack and the embedded $Si_3N_4$ layer may be used as stop region. In these embodiments, also a small layer of the first semiconductor wafer adjoining its first horizontal surface can be removed by processing the opposite surface 251.

Processing the opposite surface 251 may include polishing, etching, grinding, a CMP process or a combination thereof. For example, the holder-mounted semiconductor substrate 250 may be thinned by a CMP process, a polishing process or a grinding process. The process is typically stopped when the torque between the holder and a pad or a polishing disk characteristically changes by reaching the dielectric region 8. Furthermore, a layered dielectric region 8 may be used so that the thinning may be stopped when a different layer of dielectric region 8 is reached.

When the dielectric region 8 is formed at the second horizontal surface 261 of the second semiconductor wafer 201, processing of the opposite surface 251 typically further includes a silicon etching process to remove remaining semiconductor material after a CMP process, a polishing process or a grinding process. Furthermore, short oxide etching processes to remove the thin oxide layer for bonding and back etching of the optional poly-Si layer may additionally be used. In other embodiments the opposite surface 251 is processed to thin the semiconductor substrate at least close to the dielectric region 8. The remaining silicon adjoining the dielectric region 8 can be removed e.g. by a thermal or anodic oxidation process. The remaining silicon can also be etched away only in a region or a part of the region adjoining dielectric region 8 by a masked isotropic or anisotropic silicon etch which can use the dielectric region 8 as an etch stop.

Figure 21:
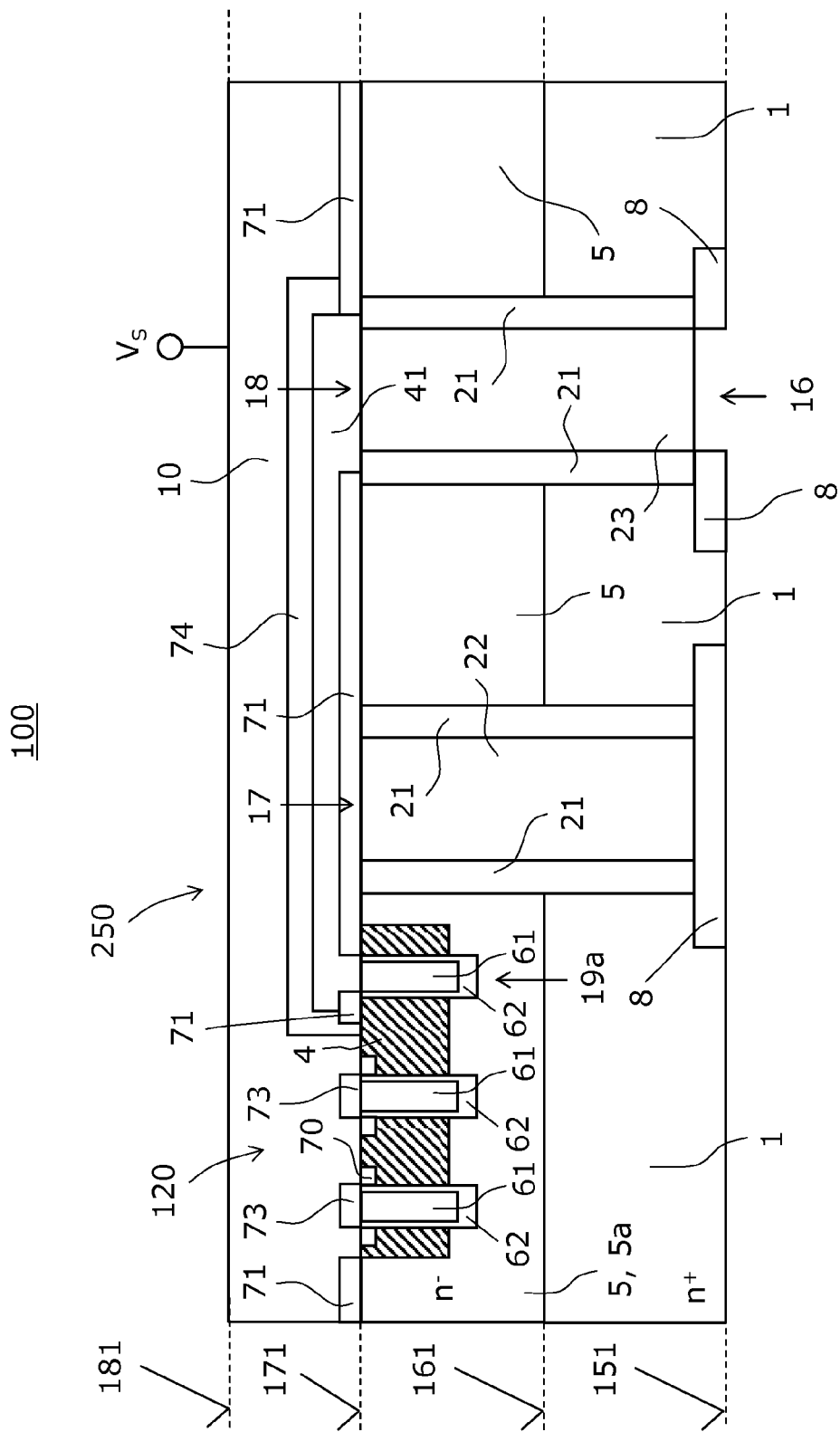

Referring to FIG. 21, a vertical trench 16 is etched from the back surface 151 through the dielectric region 8 adjoining the right deep vertical trench 18 and to the conductive plug 23. The semiconductor substrate 250 is typically flipped or turned upside down after having finished processing of the opposite surface 251 and before etching the vertical trench 16. However, for a better understanding such upside down turning of the semiconductor substrate 250 is not illustrated.

Depending on the type and/or properties of the semiconductor device to be manufactured, further implantation and drive in processes may be performed on the back surface 151. For example, a boron implantation may be used to form a pt-type semiconductor layer which adjoins the back surface 151, when an IGBT is to be manufactured. These layers may, however, be provided and/or formed prior to wafer bonding as illustrated with respect to FIGS. 6 and 7.

Figure 22:
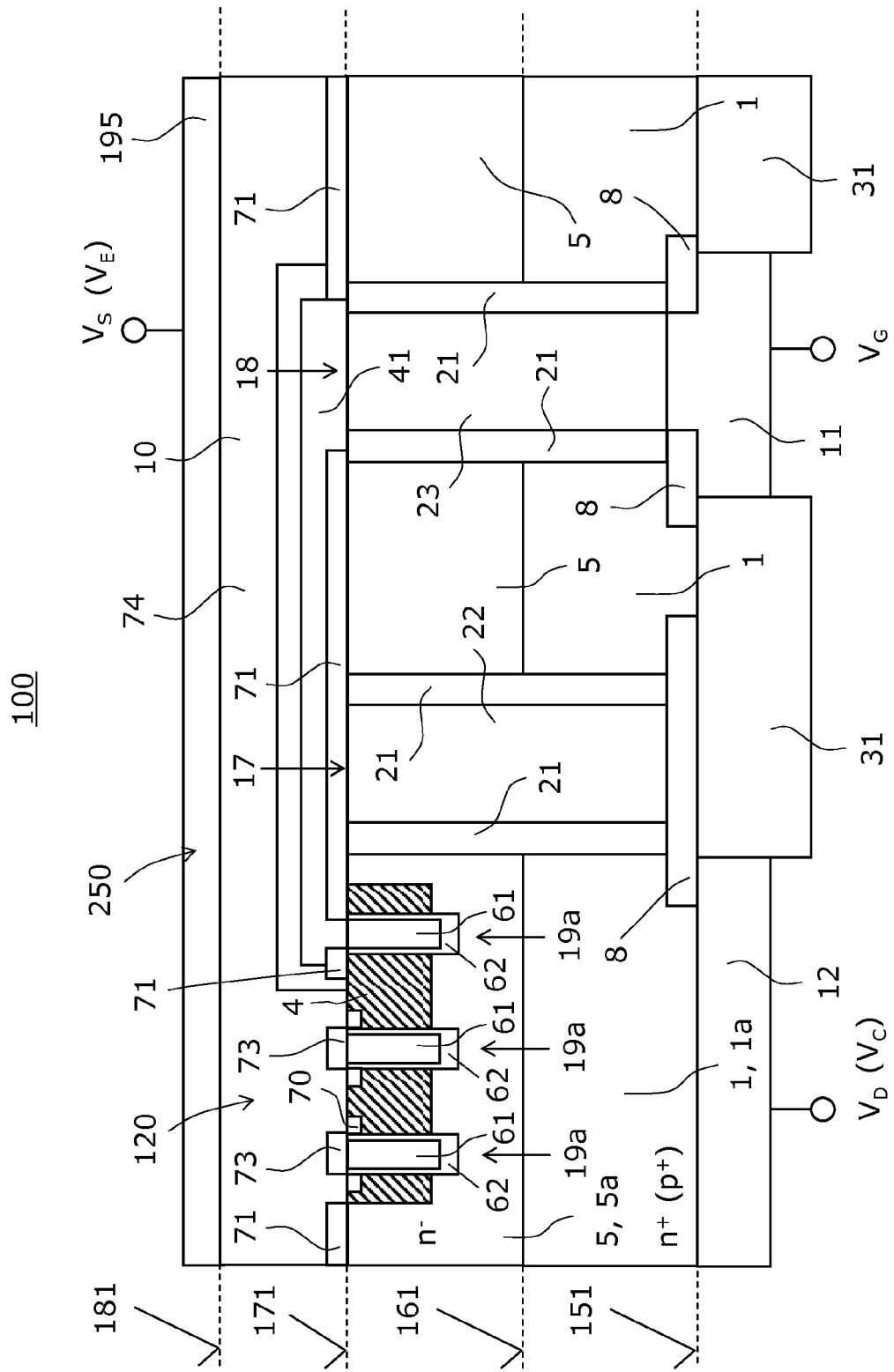

Thereafter, a second metallization 11 in ohmic contact with the conductive plug 23 and a third metallization 12 in ohmic contact with a portion 1a of the first semiconductor layer 1 are formed on the back surface 151. In the following the first portion 1a is also referred to as a third doped region 1a. For example, an electrically conductive material such as a highly doped poly-Si or a metal may be deposited on the back surface 151 so that the vertical trench 16 is preferably completely filled and so that the back surface 151 is completely covered. In other embodiments, plugs, for example of doped poly-Si or Tungsten, may be provided between the second metallization 11 and the control wiring 41. Thereafter, the deposited electrically conductive material can be etched back using a mask to form a second metallization 11 and a third metallization 12 on the back surface 151 which are separated from each other. Further, a front side insulation 31 can be formed between the second metallization 11 and a third metallization 12, and on exposed portions of the semiconductor substrate during back etching of the deposited electrically conductive material. The resulting semiconductor device 100 is illustrated in FIG. 22. The front side insulation 31 can partly cover the second metallization 11 and the third metallization 12. This is, however, not illustrated in FIG. 22.

The second metallization 11 can form a control metallization and gate metallization, respectively, to which a gate potential $V_G$ may be applied during device operation. A low ohmic current path is formed between the gate metallization 11 and the gate electrodes 61 of the transistor structure 120. In the context of the present specification, the terms "low ohmic current path" and "low resistive current path" are used synonymously. Further, the terms "low ohmic contact" and "low resistive contact" are used synonymously in the context of the present specification. A part of the low ohmic current path extends between the main horizontal surface 171 and the gate metallization 11 through the conductive plug 23 in a via region defined by the side walls 21 of the deep vertical trench 18, i.e. along the side walls 21 of the deep vertical trench 18.

As explained above, the third metallization 12 can be formed on and in ohmic contact with a third doped region 1a. The third metallization 12 is in the following also referred to as further metallization. The third doped region 1a is formed from a portion of the first semiconductor layer 1 adjoining the deep vertical trench 17 and thus arranged below the gate electrodes 61. The third doped region 1a adjoins the fourth doped region 5a which is formed from a portion of the epitaxial semiconductor layer 5. The fourth doped region 5a can form a drift region of the transistor structure 120 having a lower maximum doping concentration in comparison with the third doped region 1a.

When the doping types of the third doped region 1a and the fourth doped region 5a are equal, the third doped region 1a and the third metallization 12 can form a drain contact region and a drain metallization, respectively. In this embodiment, the first metallization 10 forms a source metallization and is in ohmic contact with the first doped region 4 forming a body region and the second doped regions 70 forming source regions. Accordingly, the semiconductor device 100 may be operated as a MOSFET.

According to an embodiment, MOSFET 100 is mounted, for example glued or soldered, with the source metallization 10 and the top surface 181 of the source metallization 10, respectively, to a printed circuit board or a simple lead frame 195. The lead frame 195 may, for example, be mounted to a chassis of a car on electric ground potential for applications that require a low side switch. Therefore, semiconductor device 100 may also be denoted as source-down MOSFET. By mounting the lead frame 195 to the chassis at ground potential, no further insulation of the source-down MOSFET 100 is typically required. Furthermore, the source-down MOSFET 100 is typically a power MOSFET. Due to the small distance between the source metallization 10 and channel regions, which are typically formed in the body region 4 along the gate dielectric regions 62, and due to the large contact surface between the source metallization 10 and the lead frame 195, the heat dissipation through the source metallization 10 to the chassis is very high.

When the doping types of the third doped region 1a and the fourth doped region 5a are opposite, the third doped region 1a and the third metallization 12 can form a collector region and a collector metallization, respectively. In this embodiment, the first metallization 10 forms an emitter metallization which is in ohmic contact with the first doped region 4 forming a body region and the second doped regions 70 forming emitter regions. Accordingly, the semiconductor device 100 may be operated as an IGBT. The IGBT 100 may also be mounted, for example glued or soldered, with the emitter metallization 10 to a simple lead frame or a printed circuit board.

According to an embodiment, field plates are formed in the shallow trenches 19, 19a and below the insulated gate electrodes 61, 62. The field plates can be connected to source potential. Furthermore, the insulated gate electrodes 61, 62 may also be formed on the main horizontal surface 171.

In the exemplary embodiments illustrated in FIGS. 16 to 22, the insulated gate electrodes 61, 62 are formed in shallow trenches 19, 19a. The insulated gate electrodes 61, 62 may, however, also be formed on the main horizontal surface 171. For example, the vertical transistor structure 120 may be formed as a DMOS-structure (double-diffused metal-oxide semiconductor field effect transistor-structure).

According to an embodiment, the front side insulation 31 is formed at low temperatures, typically at temperatures below about 400° C., more typically below about 250° C. Accordingly, no higher temperature processes are required after forming the transistor structure 120. For example, the front side insulation 31 may be formed by depositing and curing of an oxide or a resin such as an imide. Curing may be done thermally or by UV-exposure. The insulating properties of the formed polymer insulation 31, for example a polyimide front side insulation, are typically not as good as those of silicon oxide formed as high temperature thermal oxide. However, the manufacturing method explained with reference to FIGS. 1 to 22 allows forming of thermal oxides in regions of potentially high field strength prior to forming the metallizations 10 to 12 which may be affected by higher temperatures. Accordingly, the front side insulation formed on the back surface 151 may have a lower dielectric strength and/or defect concentrations than typically required in regions of potentially high field strength. As explained with reference to the FIGS. 1 to 22, the gate dielectric regions 61, as well as the side wall insulations 22 of the deep vertical trenches 17, 18 and the dielectric region 8 are formed prior to forming the metallizations 10 to 12. Therefore, the metallizations 10 to 12 may, for example, be made of aluminum or an aluminum alloy tolerating only temperatures below about 400° C.

When both the dielectric region 8 and the side wall insulations 22 of the vertical trenches are formed as highly resistive dielectrics, for example as high temperature thermal oxides, the semiconductor regions adjoining the vertical trench 17 may also be grounded during device operation without risking a break down. Even the vertical trench 17 may be filled with a conductive material in Ohmic contact to the first metallization 10 without risking a break down.

Furthermore, the manufacturing methods explained with reference to FIGS. 1 to 22 allow complete processing of one side of the semiconductor substrate 250 prior to processing the other side. Accordingly, handling of the semiconductor substrate 250 is typically simplified and thus the risk of damaging and/or breaking the semiconductor substrate 250 reduced. This applies also to the manufacturing methods explained with reference to the following Figures.

Figure 23:
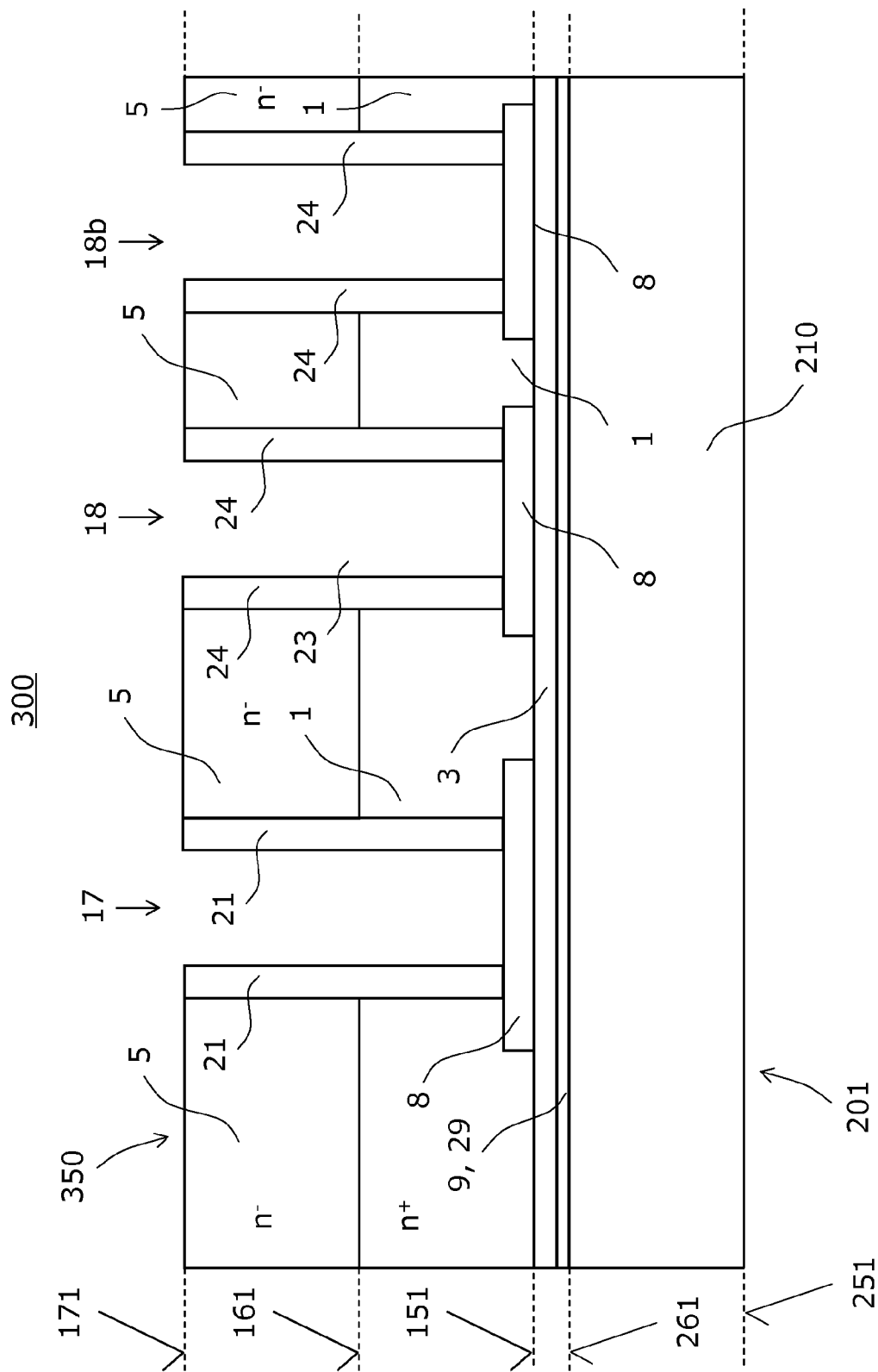
FIGS. 23-25 schematically illustrate, in vertical cross-sections, processes of manufacturing a semiconductor device according to one or more embodiments.
Figure 24:
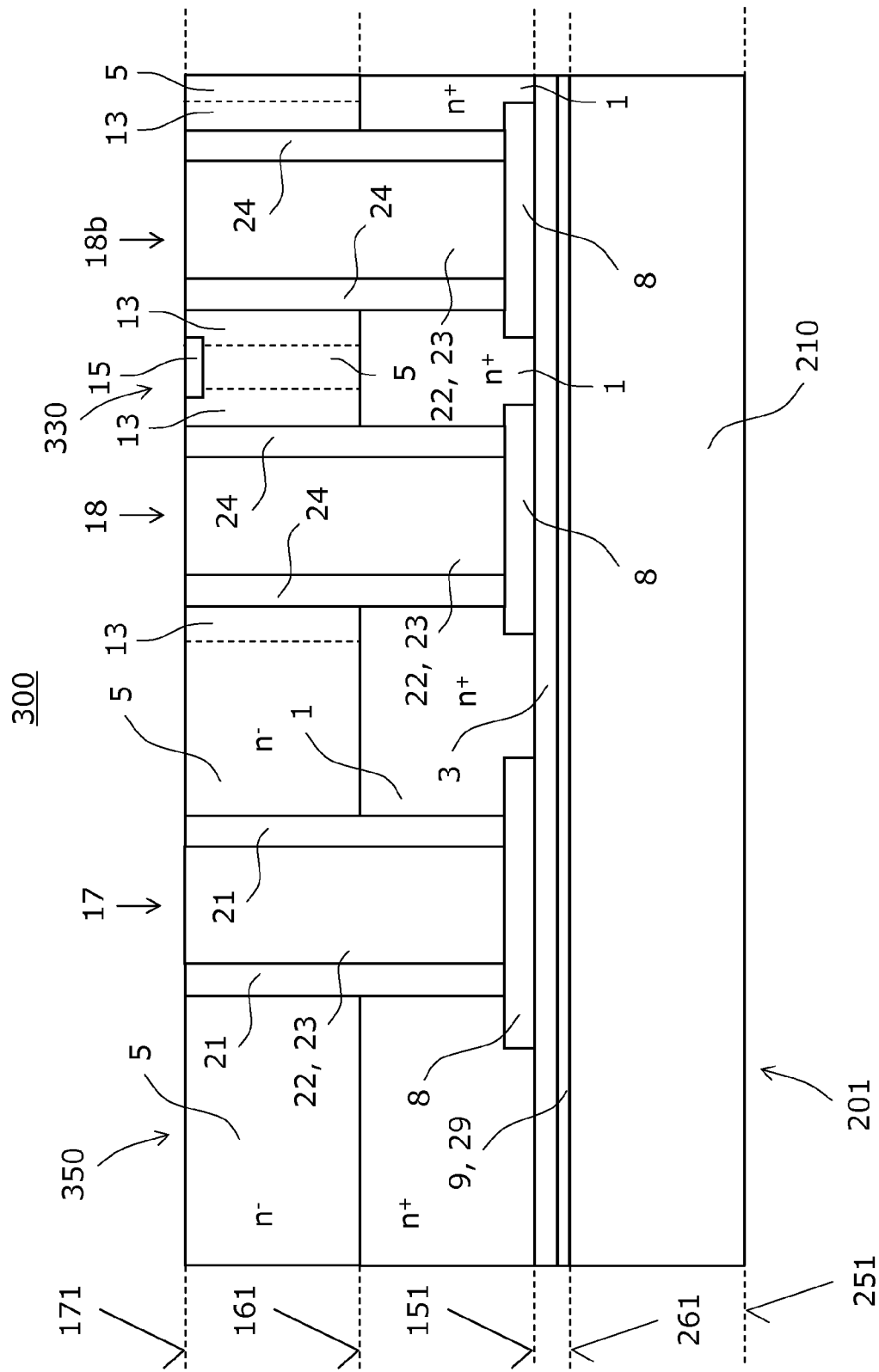
Figure 25:
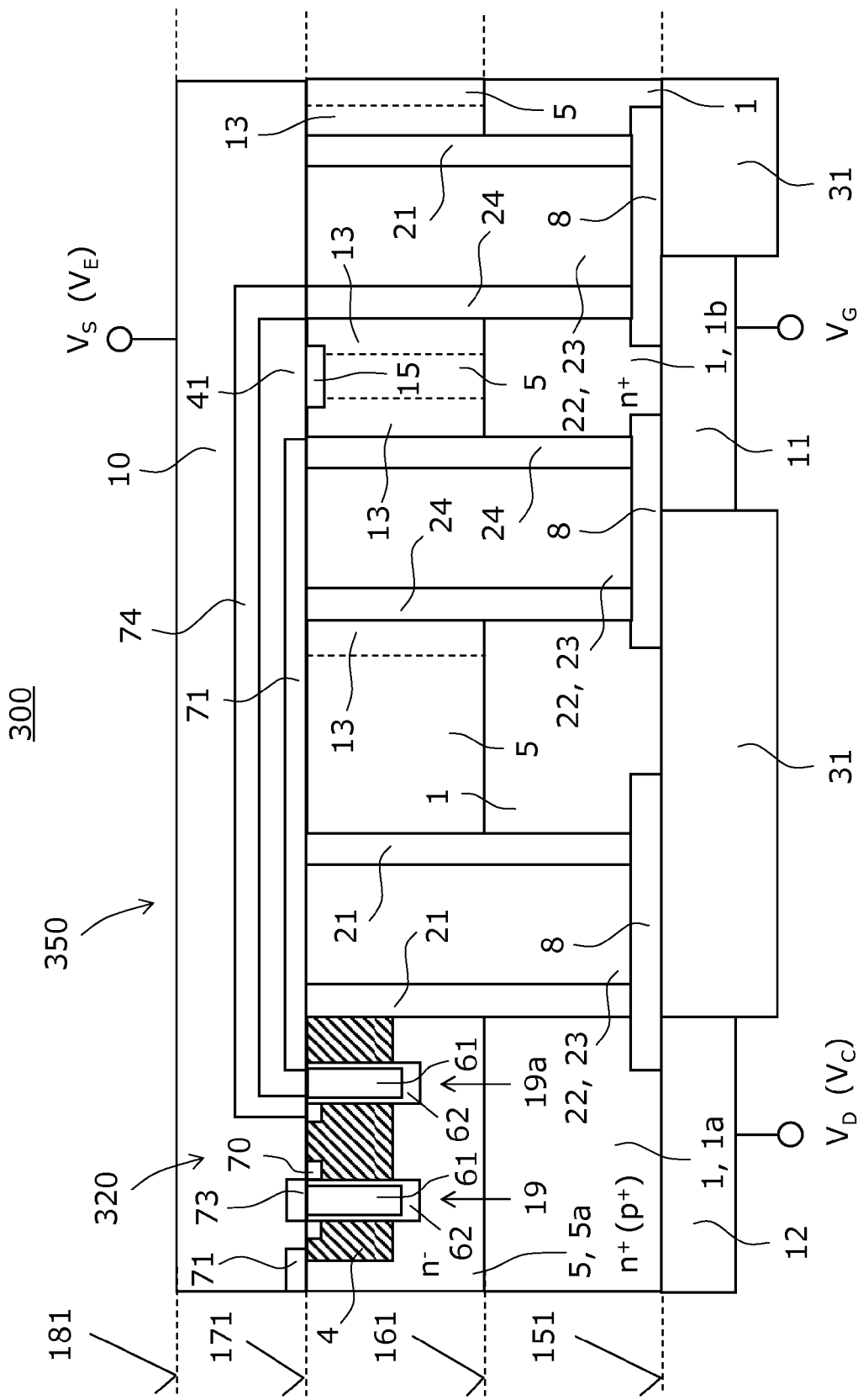

With respect to FIGS. 23 to 25 methods for forming a semiconductor device 300 according to several embodiments are illustrated in respective vertical cross-sections. The semiconductor substrate 350 illustrated in FIG. 23 is similar to the semiconductor substrate 250 illustrate in FIG. 13. However, the semiconductor substrate 350 has three deep vertical trenches 17, 18, 18b which extend from a main horizontal surface 171 to respective dielectric regions 8 which are completely embedded in the semiconductor substrate 350.

The number of dielectric regions forming etch stops for deep vertical trenches and stop regions for thinning the semiconductor substrate may very depending on the semiconductor device to be manufactured. The deep vertical trenches can have insulated side walls defining a via region for contacting a control electrode of a transistor structure. The control electrode can be arranged next to the main horizontal surface and in ohmic contact with a control metallization arranged opposite to the main horizontal surface. As illustrated with respect to FIGS. 1 to 22, at least one deep vertical trench is used to define the via region for providing a low ohmic current path between the side walls of the at least one deep vertical trench. Further deep vertical trenches may be used to separate different areas of the semiconductor device to be manufactured, whereas the further deep vertical trenches may be filled with insulting materials or with respective conductive plugs in contact to a reference potential, for example ground, during operation. Further, several conducting vias may be provided. Furthermore, using more than one dielectric region as stop regions for thinning the semiconductor substrate, for example suitably distributed embedded dielectric regions, may facilitate the thinning processes.

In this regard, a plurality of semiconductor devices may be part of the semiconductor substrate and wafer stack, respectively, which are processed together, and separated to form the individual semiconductor devices at the end of such processing. In these embodiments, the illustrated vertical cross-sections typically correspond only to a representative section only.

The semiconductor substrate 350 illustrated in FIG. 23 can be manufactured as explained with reference to FIGS. 1 to 13 for the semiconductor substrate 100, but with three deep vertical trenches 17, 18, 18b extending to respective dielectric regions 8. Furthermore, the insulating layers 24 at the side walls of the vertical trenches 18, 18b can be formed as doped dielectric layers, for example as doped glass layers.

According to an embodiment, higher doped semiconductor regions 13 of the first conductivity type ($n^+$-type) are formed in semiconductor regions of the semiconductor substrate 350 which are adjacent the deep vertical trenches 18, 18b and the insulating layers 24 of the deep vertical trenches 18, 18b, respectively. This may be done by outdiffusing dopants from the insulating layers 24 through the side walls of the deep vertical trenches 18, 18b into the surrounding portions of the epitaxial layer 5 of the semiconductor substrate 350. The resulting semiconductor substrate 350 is illustrated in FIG. 24 after forming an optional highly doped contact region 15 at the main horizontal surface 171 in electric contact with the higher doped semiconductor regions 13, and after filling the residual portions of the deep vertical trenches 17, 18, 18b with a first material 22 and a second material 23, respectively. Thereby, a low ohmic current path is formed in a via region between the two deep vertical trenches 18, 18b. The low ohmic current path can extend from the main horizontal surface 171 to the first horizontal surface 151 of the second semiconductor wafer 201, which later typically forms a back surface. The residual portions of the deep vertical trenches 17, 18, 18b may be filled with a conductive or an insulating material. Furthermore, the deep vertical trenches 17, 18, 18b may be filled with the same or different materials.

The higher doped semiconductor regions 13 (illustrated in dashed lines) are formed adjacent the deep vertical trenches 18, 18a at least in the epitaxial layer 5 of the via region, but can also be formed along the complete side walls of the deep vertical trenches 18, 18a. In other embodiments the entire mesa between the deep vertical trenches 18 and 18b forms a higher doped semiconductor region 13.

Forming the higher doped region 13 may also include: deposition of doped polysilicon or oxide, followed by a diffusion process; a gas phase doping process; or an implantation and/or diffusion process in which dopant atoms are implanted or diffused via the side walls of the deep vertical trenches 18, 18a into adjoining semiconductor regions prior to forming the insulating layers 21, 24 at side walls of the deep vertical trenches 18, 18a. In these embodiments, the insulating layers 21, 24 of the deep vertical trenches 18, 18a may be formed in a common process, for example by thermal oxidation. This applies also to embodiments in which the doped dielectric layers 24 are removed after forming the higher doped semiconductor regions 13.

Similar as explained with respect to FIGS. 15 to 19, the semiconductor substrate 350 is first finished on the side of the main horizontal surface 171. This may include forming a body region 4, source regions 70, and insulated gate electrodes 61, 62 of a transistor structure 320; as well as forming a gate wiring layer 41 insulated from the semiconductor regions of the semiconductor substrate 350 and electrically connecting the gate electrodes 61 and the low ohmic current path formed in the via region between the side walls of the deep vertical trenches 18, 18a. Further, a first metallization 10 can be formed on the main horizontal surface 171 so that the first metallization 10 is in ohmic contact with the source regions 70 and the body region 4, but insulated from the gate wiring layer 41.

Thereafter, the semiconductor substrate 350 is processed at the opposite surface 251 to form a back surface 151 by thinning the semiconductor substrate 350 using the dielectric regions 8 as a stop regions, for example in a CMP process. These processes may be carried out similar as explained with reference to FIG. 20.

Thereafter, a second metallization 11, typically forming a control metallization, is formed on the back surface 151 in ohmic contact with the gate electrodes 61 via the low ohmic current path formed in the via region between the side walls of the deep vertical trenches 18, 18a and via the gate wiring layer 41. Furthermore, a third metallization 12 can be formed in parallel with the second metallization 11 on the back surface 151. Thereafter, a front side insulation 31 can be formed between the second metallization 11 and the third metallization 12 on the back surface 151. The resulting semiconductor device 300 is illustrated in FIG. 25. The third metallization 12 is in ohmic contact with a third doped region 1a of the transistor structure 320.

Forming a vertical trench from the back surface 151 is typically not required to contact the second metallization 11 which typically forms a gate metallization as the semiconductor region 1b in the via region is typically exposed by processing the opposite surface. Accordingly, the second metallization 11 may directly be formed on the exposed area of the semiconductor region 1b.

Semiconductor device 300 is similar to semiconductor device 100 and may, depending on the conductivity type of the third doped region 1a, also be operated as source-down MOSFET or emitter-down IGBT. Accordingly, the first metallization 10 of semiconductor device 5 may also be mounted to a simple lead frame. By way of example, only two gate electrodes 61 are illustrated in FIG. 25.

Figure 26:
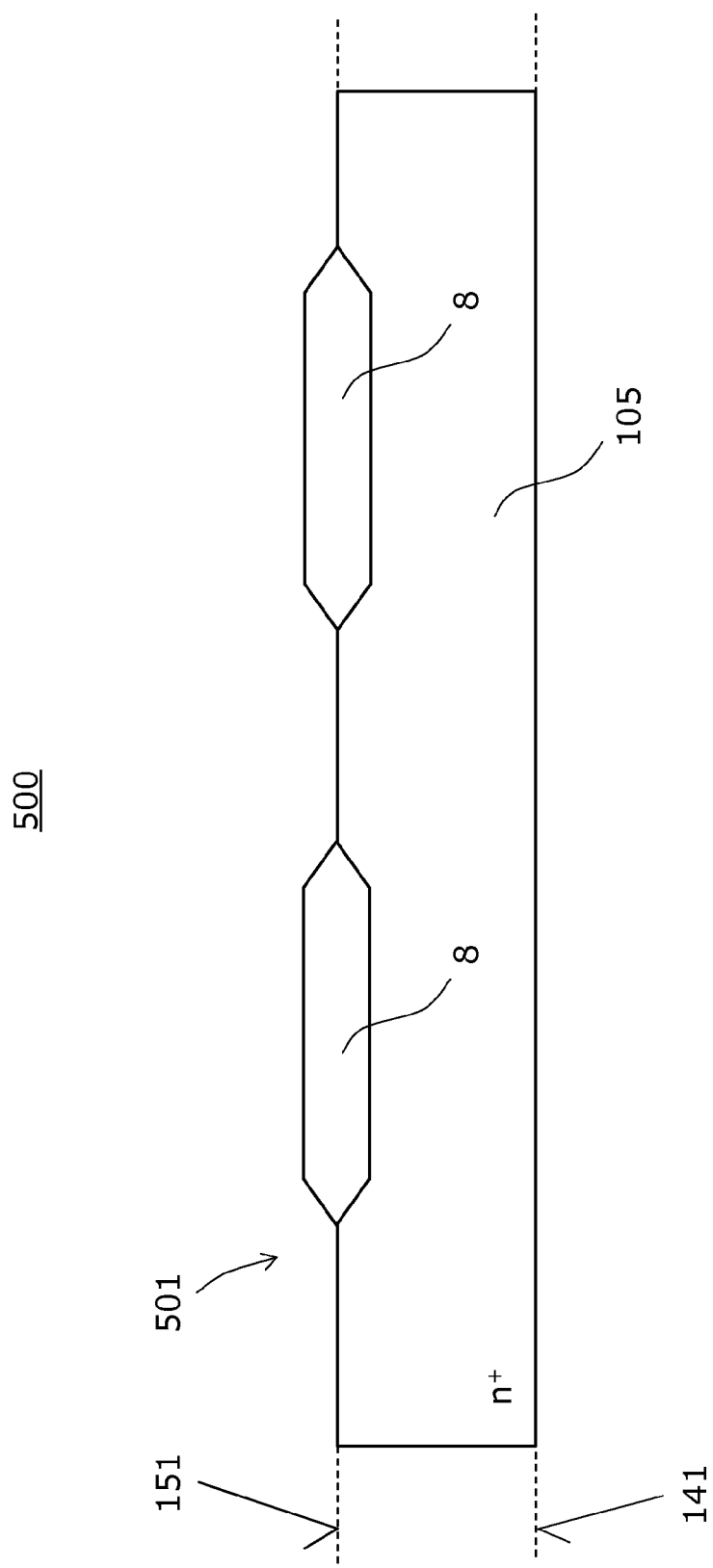
FIGS. 26-32 schematically illustrate, in vertical cross-sections, manufacturing processes of a semiconductor device in vertical cross-sections according to one or more embodiments.

With respect to FIGS. 26 to 32 methods for forming a semiconductor device 500 according to several embodiments are illustrated in respective vertical cross-sections. A semiconductor wafer 501 with a first horizontal surface 151 and an opposite surface 141 is provided. A semiconductor layer 105 of the first conductivity type may extend between the first horizontal surface 151 and the opposite surface 141. One or more dielectric region 8 are formed at the first horizontal surface 151, for example as LOCOS-regions as explained with reference to FIG. 2. The resulting semiconductor wafer 501 is illustrated in FIG. 26.

Figure 27:
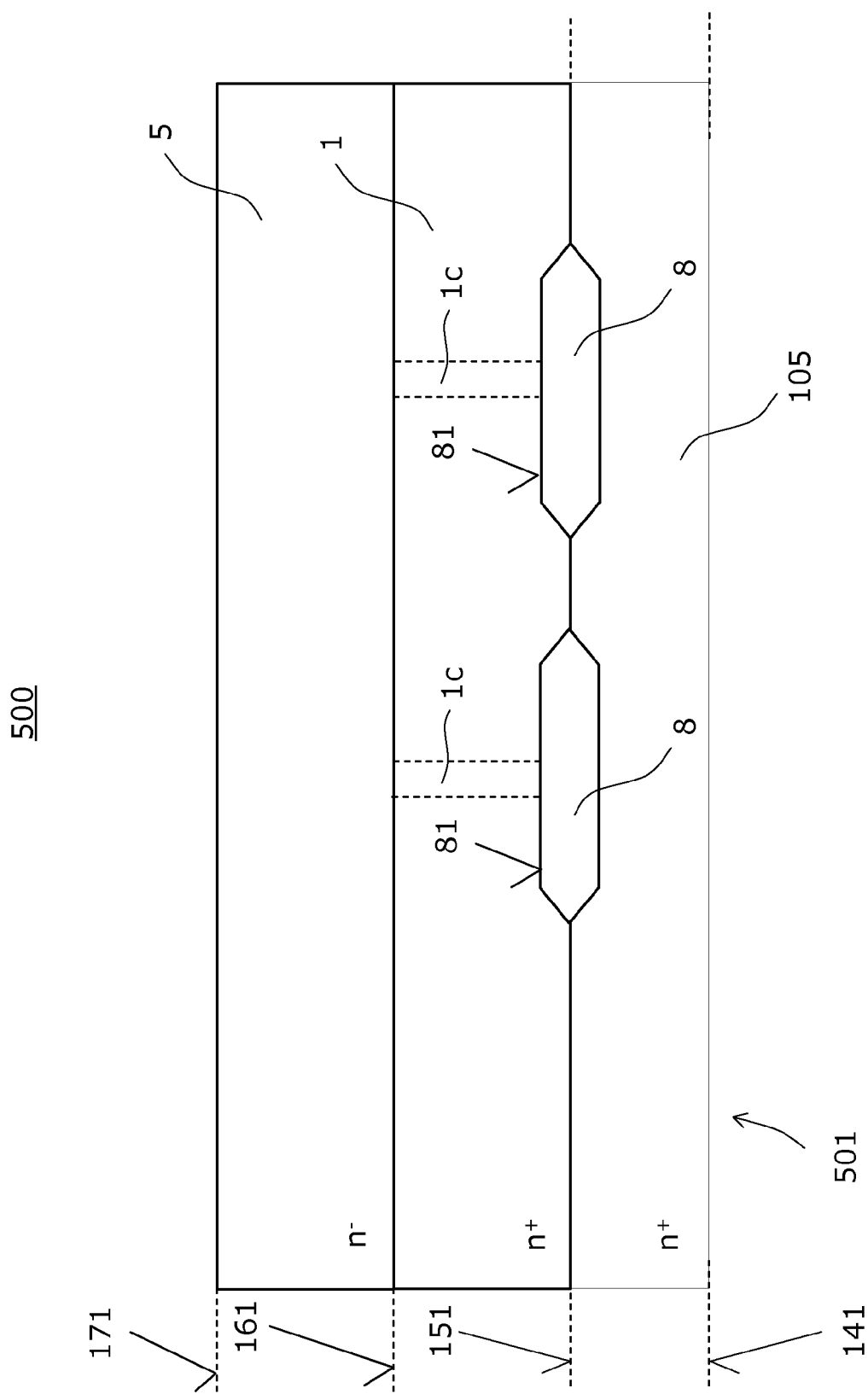

Thereafter, one or more epitaxial layer 1, 5 are formed on the first horizontal surface 151. The resulting semiconductor wafer 501 is illustrated in FIG. 27.

According to an embodiment, forming the one or more epitaxial layers 1, 5 includes an epitaxial lateral overgrowth process so that the dielectric regions 8 are completely embedded in the semiconductor wafer 501. Thereby, a main horizontal surface 171 of the semiconductor 501 or semiconductor substrate 550 is formed above the dielectric regions 8. In the exemplary embodiment illustrated in FIG. 27, a lateral overgrowth layer 1 of the first conductivity type and an epitaxial layer 5 of the first conductivity type on top of the lateral overgrowth layer 1 are formed with appropriate maximum doping concentrations. The lateral overgrowth layer 1 may also be formed as pt-type layer, for example when an n-channel IGBT is to be formed.

Figure 28:
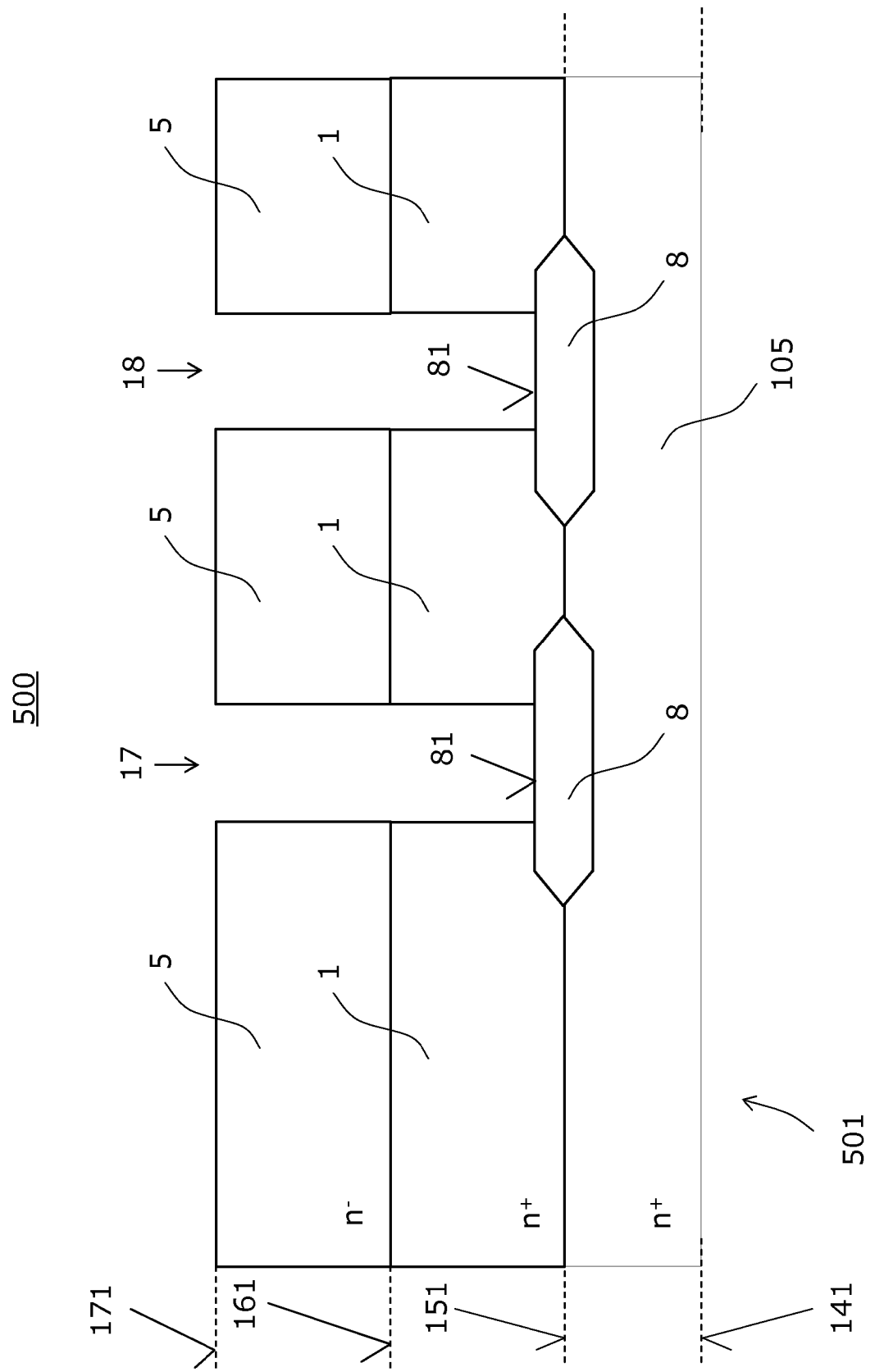

In the epitaxial lateral overgrowth process, selective epitaxial growth initially occurs in the direction normal to the surface 151 of the semiconductor wafer, i.e. in vertical direction, but then also proceeds in horizontal direction and continues over the (non-crystalline) dielectric portions 8. There might be a higher defect concentration in portions 1c of the lateral overgrowth layer 1 where two growth fronts of the epitaxial lateral overgrowth process meet above the dielectric regions 8. This is however uncritical since deep vertical trenches 17, 18 are etched from the main horizontal surface 171 into the epitaxial layer 5 and the of the lateral overgrowth layer 1 using the dielectric regions 8 as etch stops. The resulting semiconductor wafer 501 is illustrated in FIG. 28.

Thereafter, the side walls of the vertical trench 17, 18 can be insulated similar as explained with reference to FIG. 13, and the residuals of the deep vertical trenches 17, 18 are filled similar as explained with reference to FIG. 14. The resulting semiconductor wafer 501 is illustrated in FIG. 29.

Figure 29:
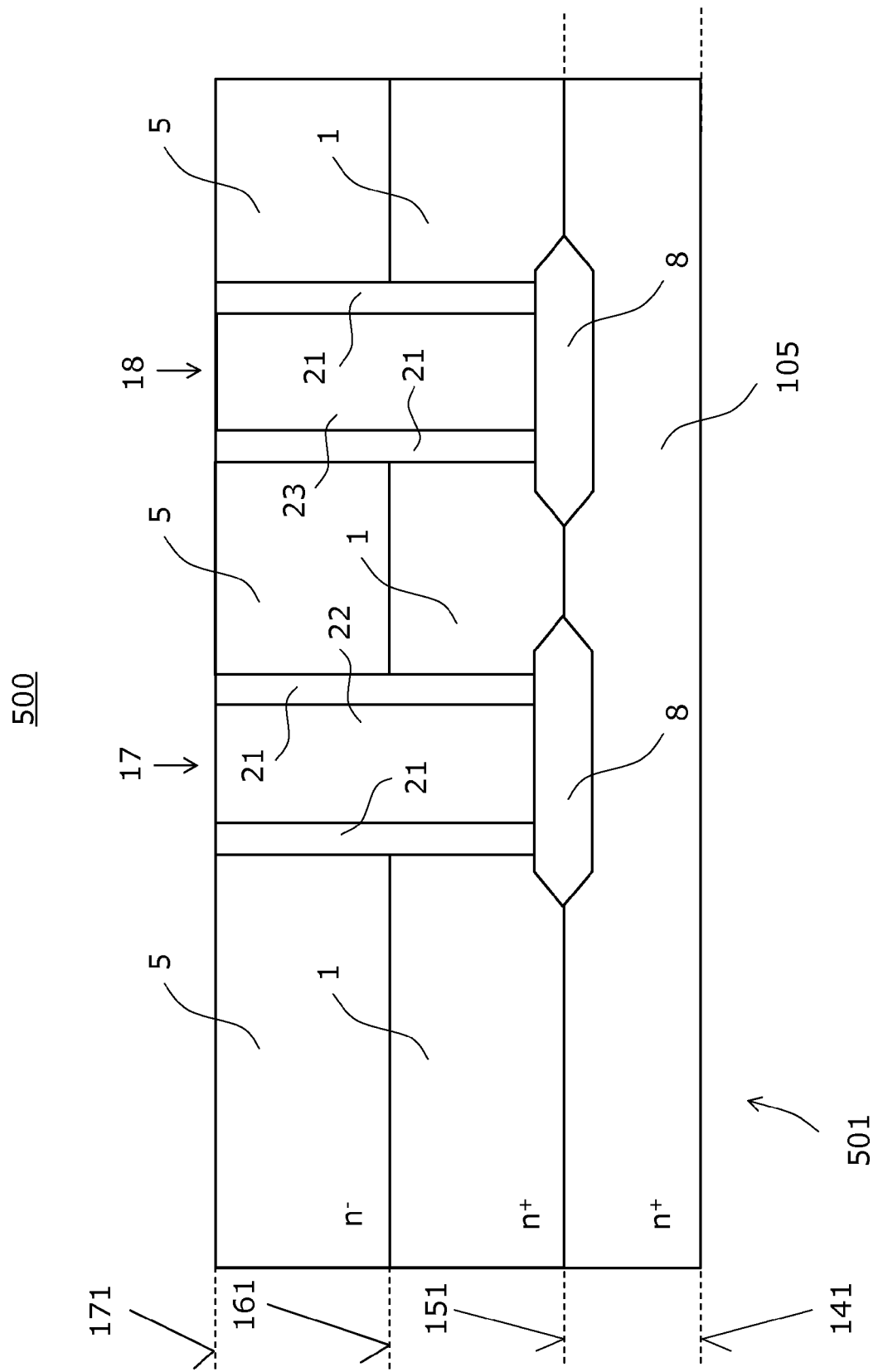

In the exemplary embodiment illustrated in FIG. 29, a conductive plug 23 is formed in the right deep vertical trench 18. Accordingly, the insulating layers 21 at the side wall of the right deep vertical trench 18 define a via region. Depending on the semiconductor device 500 to manufactured, the filling 22 of the left deep vertical trench 17 may be conductive or non-conductive.

Figure 30:
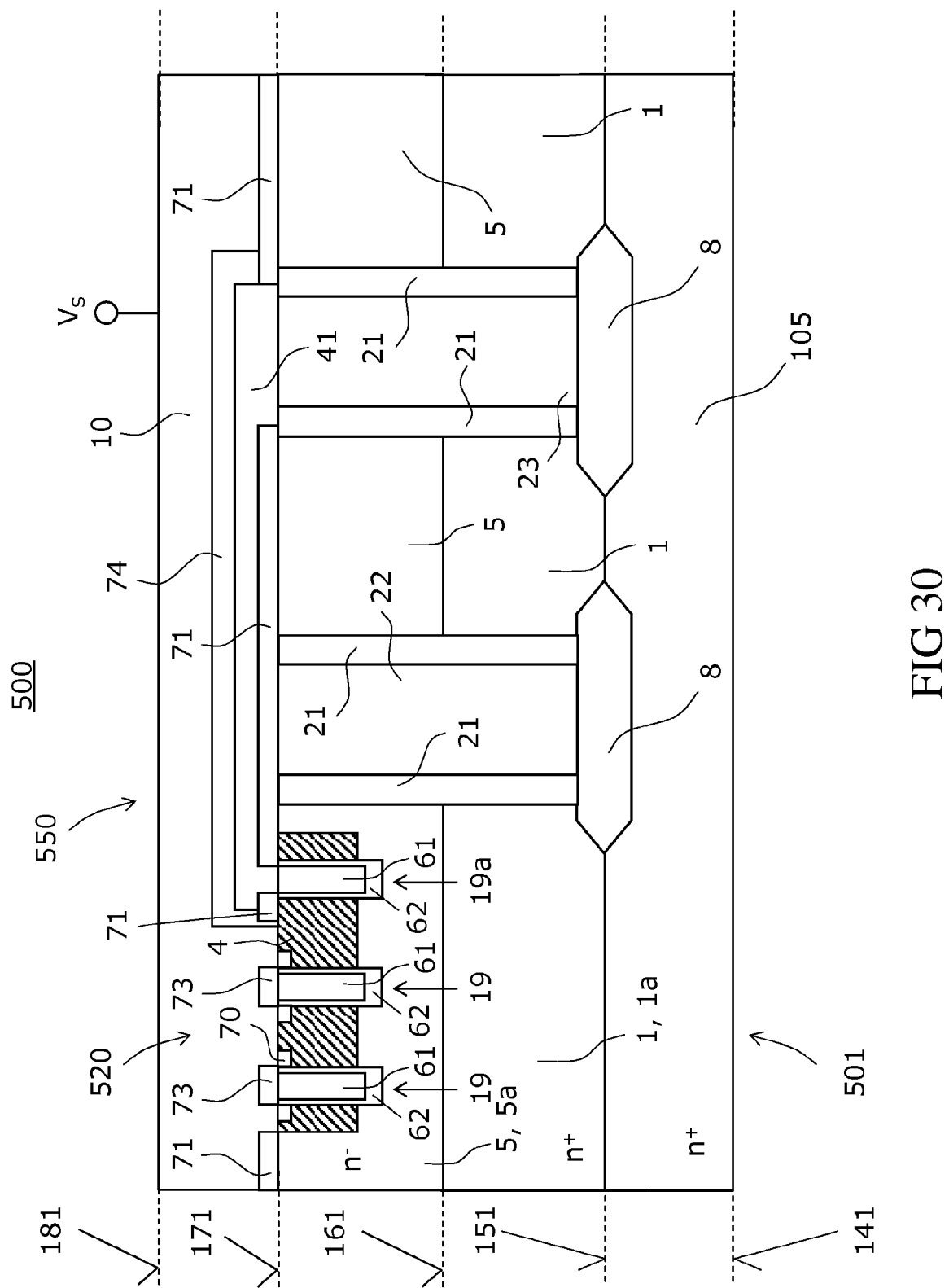

Similar as explained with respect to FIGS. 15 to 19, the semiconductor wafer 501 is first finished on the side of the main horizontal surface 171. This may include forming a body region 4, source regions 70, and insulated gate electrodes 61, 62 of a transistor structure 520; as well as forming a gate wiring layer 41 insulated from the semiconductor regions of the semiconductor wafer 501 and electrically connecting the gate electrodes 61 and the low ohmic current path formed in the via region between the side walls of the deep vertical trenches 17, 18. Further, a first metallization 10 can be formed on the main horizontal surface 171 so that the first metallization 10 is in ohmic contact with the source regions 70 and the body region 4, but insulated from the gate wiring layer 41. The resulting semiconductor wafer 501 is illustrated in FIG. 30.

Figure 31:
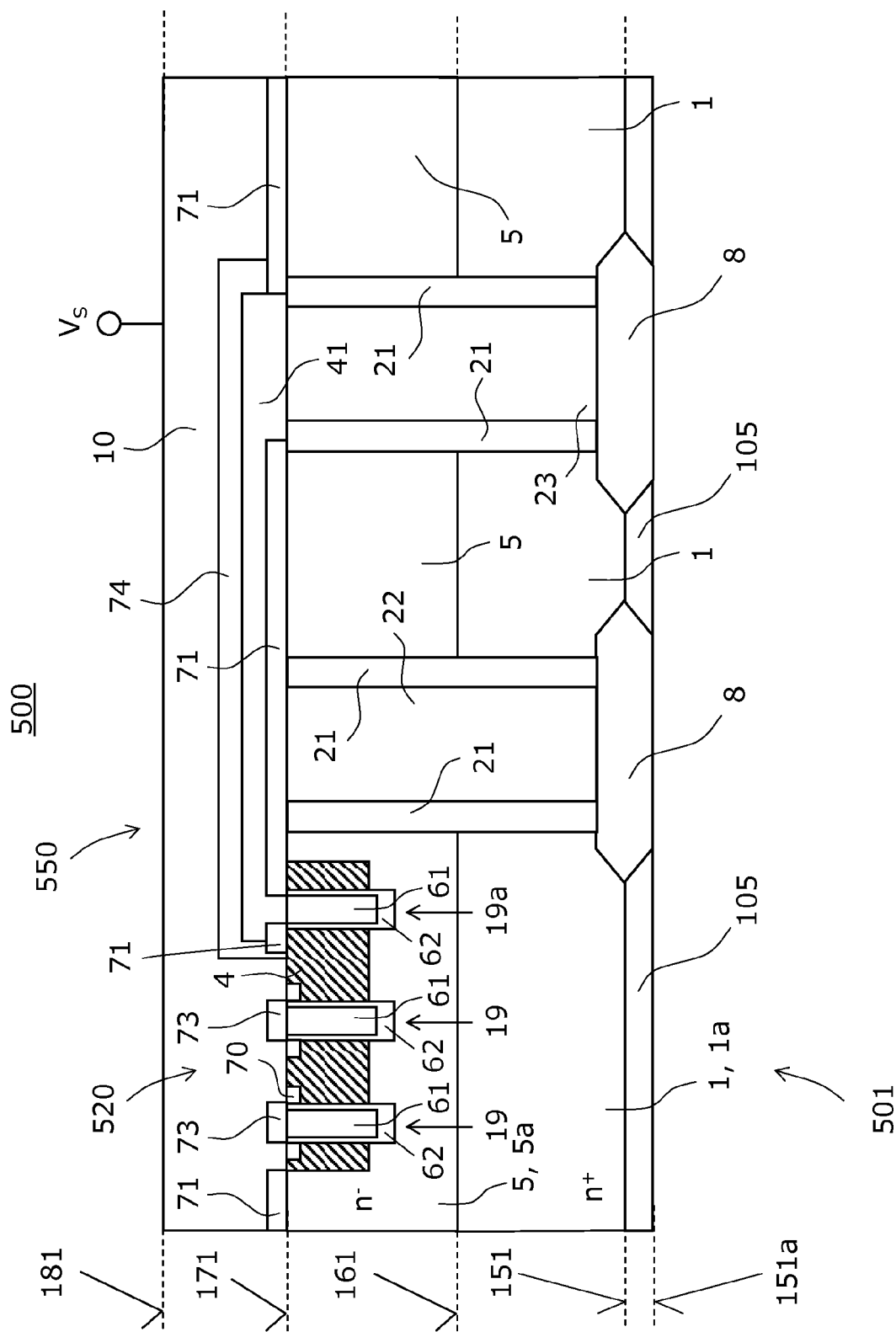

Thereafter, the semiconductor wafer 501 is processed at the opposite surface 141 to form a back surface 151a by thinning the semiconductor wafer 501 using the dielectric regions 8 as stop regions, for example in a CMP process. These processes may be carried out similar as explained with reference to FIG. 20. The resulting semiconductor wafer 501 is illustrated in FIG. 31.

According to embodiments, the lateral overgrowth process explained with reference to FIG. 27 is performed on a substantially flat first horizontal surface 151 of the semiconductor wafer 501 which is similar to one of the wafers illustrated in FIGS. 3 to 7. In these embodiments, the back surface 151a may correspond to the first horizontal surface 151.

Again referring to FIG. 31, a vertical trench 16 is etched from back surface 151a through the dielectric region 8 adjoining the right deep vertical trench 18 and to the conductive plug 23.

Figure 32:
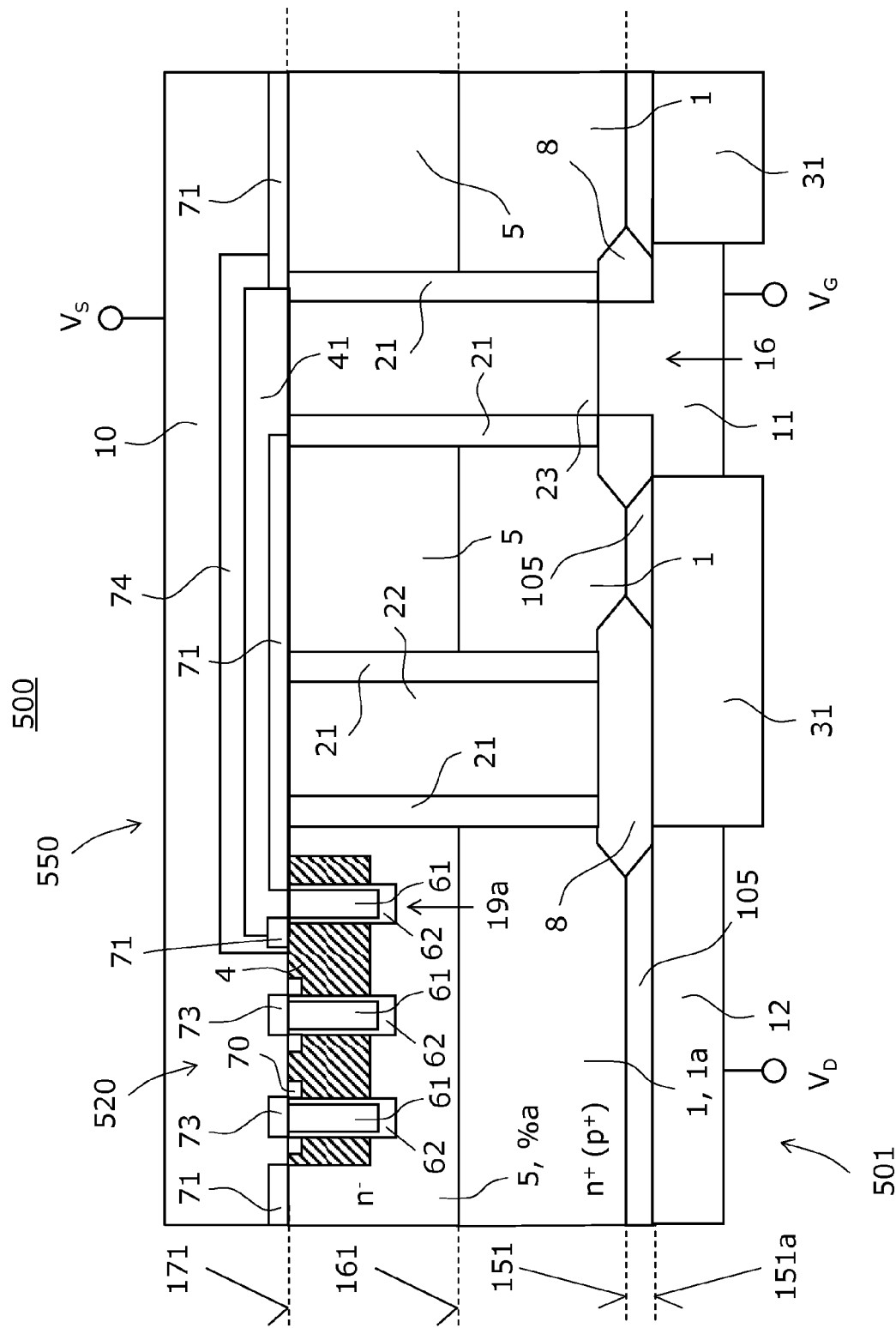

Thereafter, a second metallization 11, typically forming a control metallization, is formed on the back surface 151a in ohmic contact with the gate electrodes 61 via the low ohmic current path formed in the via region between the side walls of the deep vertical trenches 18, 18a and via the gate wiring layer 41. Furthermore, a third metallization 12 can be formed in parallel with the second metallization 11 on the back surface 151. The third metallization 12 is in ohmic contact with a third doped region 1a of the transistor structure 520. Thereafter, a front side insulation 31 can be formed on the back surface 151 and between the second metallization 11 and the third metallization 12. The resulting semiconductor wafer 500 is illustrated in FIG. 32.

Semiconductor device 500 is similar to semiconductor device 100 and may, depending on the conductivity type of the third doped region 1a, also be operated as source-down MOSFET or emitter-down IGBT. Accordingly, the first metallization 10 of semiconductor device 5 may also be mounted to a simple lead frame.

Alternatively, the gate electrodes 61 are connected to the control metallization 11 via a low ohmic current path through higher doped semiconductor regions of a via region defined by the side walls of two deep vertical trenches as explained with reference to FIGS. 23 to 25.

Figure 33:
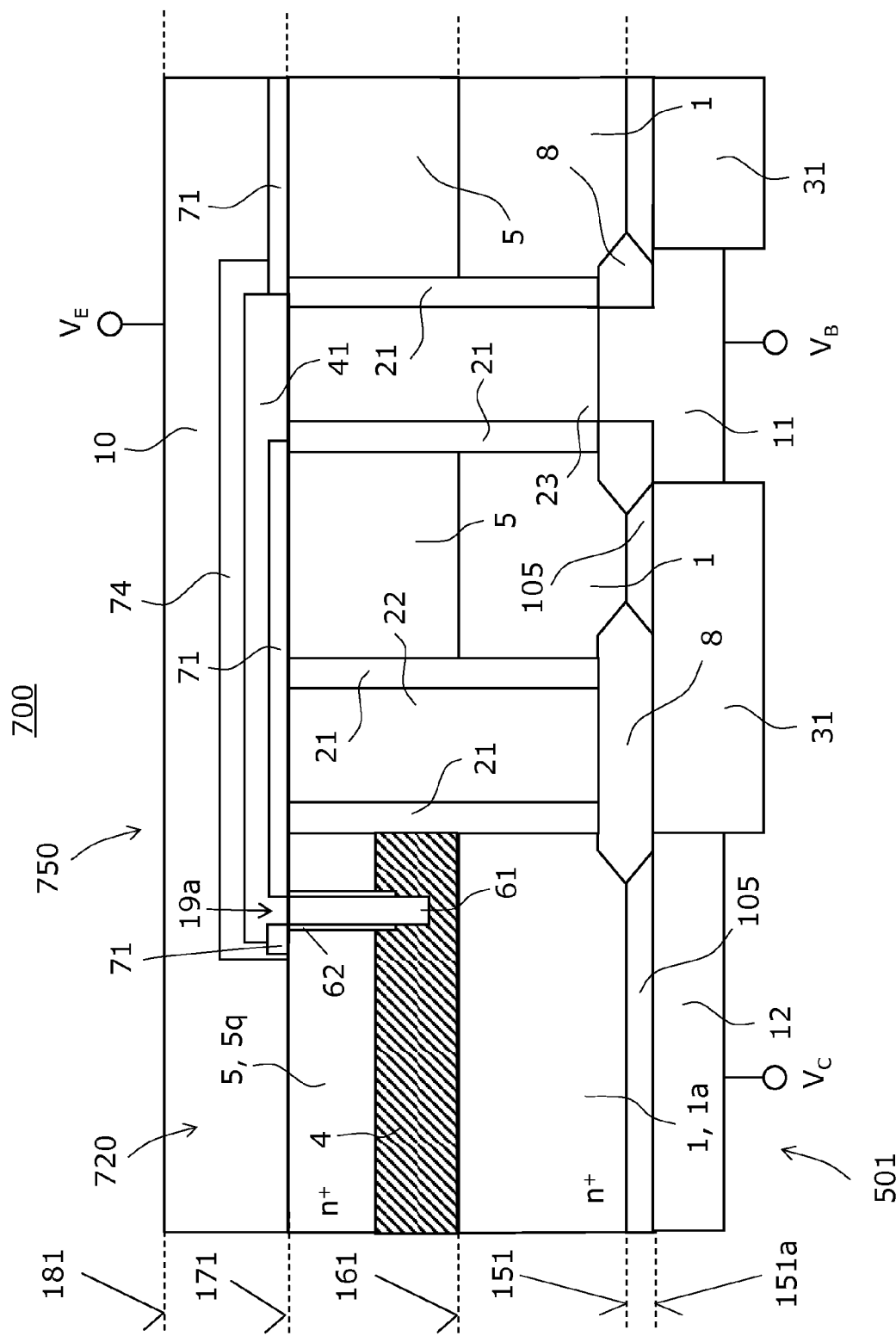
FIG. 33 schematically illustrates, in a vertical cross-section, a semiconductor device according to one or more embodiments.

FIG. 33 schematically illustrates another embodiment of a semiconductor device 700 in a section of a vertical cross-section. Semiconductor device 700 is similar to semiconductor device 500 and may also be operated as a transistor. However, the transistor structure 720 of semiconductor device 700 is formed as vertical BJT in a semiconductor substrate 750. Accordingly, the first metallization 10 arranged on the main horizontal surface 171, the second metallization 11 and the third metallization 12 arranged on the back surface 151a typically form an emitter metallization, a base metallization and a collector metallization, respectively.

The transistor structure 720 of the semiconductor device 700 may be formed similarly to the transistor structures of the semiconductor devices 100, 300 and 500. However, only one control electrode 61 may be formed, even for a power semiconductor device. The control electrode 61 typically forming a base electrode is formed in ohmic contact with a base region 4.

Furthermore, the low ohmic current path for connecting the gate electrode 61 and the control metallization 11 may also be realized through higher doped semiconductor regions of a via region defined by the side walls of two deep vertical trenches as explained with reference to FIGS. 23 to 25.

The semiconductor devices described herein have in common that a control electrode of a transistor structure is connected via a control wiring arranged on a main horizontal surface of the semiconductor substrate or semiconductor wafer, and a low ohmic current path in a via region through the semiconductor substrate or semiconductor wafer to a control metallization arranged opposite to the main horizontal surface. A first metallization is insulated from the control wiring and arranged on the main horizontal surface and the control wiring, respectively. The first metallization may be used to glue or solder the semiconductor device to a simple lead frame. Thereby, additional costs for a segmented lead frame may be avoided, for example when a high and a low side switch are to be integrated in one package. Further, a high cooling efficiency and a broad electric connection to a reference potential, for example ground, may be provided. This is particularly interesting for power applications, for example in automotive applications. The semiconductor devices described herein may have one common first metallization on the main horizontal surface and several control metallizations arranged opposite to the common first metallization. Further, for each control metallization a respective third metallization is typically arranged opposite to the common first metallization. Accordingly, several vertical transistor structures may be integrated in one semiconductor device.

The via region is typically defined by side wall insulations of deep vertical trenches extending from the main horizontal surface to insulating region arranged at a back surface the semiconductor substrate or semiconductor wafer.

Furthermore, the low ohmic current path may at least partially be formed in an area of the semiconductor substrate or the semiconductor wafer adjoining the insulated deep vertical trench or in the insulated deep vertical trench.

Alternatively, similar semiconductor devices as illustrated in FIGS. 22, 25, 32 and 31 but with opposite doping relations are manufactured and provided, respectively.

Furthermore, the transistor structure may be a field effect transistor structure such as a MOSFET-structure, a JFET or an IGBT-structure, a bipolar transistor structure or a combination thereof. In addition, diodes may be integrated into the semiconductor devices. For example, an IGBT with integrated free-wheeling diode may be formed and/or provided.

During manufacturing, the dielectric regions can be used as etch stop regions for forming the deep vertical trenches and as stop regions for thinning. Accordingly, manufacturing is facilitated.

Further, the dielectric regions, the side wall insulations adjoining the respective dielectric regions as well as any gate dielectric regions are typically formed prior to the metallizations. Thereby, the dielectric regions and the side wall insulations may be formed with low defect concentrations and high dielectric strength, respectively, for example by thermal oxidation in a temperature range of about 600° C. to about 1200° C. Accordingly, no high temperature processes are typically required after forming the metallizations which may, therefore, be formed as aluminum layers, tin layers or any other metal or alloy layer with comparatively low melting point.

Furthermore, the methods described herein allow complete processing of one side of source-down semiconductor devices and emitter-down semiconductor devices prior to processing the opposite side. Accordingly, handling of the semiconductor wafer or semiconductor substrate is facilitated and hence risk of damage reduced.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a semiconductor substrate, comprising:
     a main horizontal surface;
     a back surface arranged opposite the main horizontal surface;
     a vertical transistor structure comprising a doped region and a control electrode arranged next to the main horizontal surface;
     an insulating region arranged at or close to the back surface;
     a deep vertical trench extending from the main horizontal surface through the semiconductor substrate and to the insulating region;
     an insulating layer arranged on a side wall of the deep vertical trench; and
     a low ohmic current path extending at least partially along the insulating layer and between the main horizontal surface and the back surface;
       a first metallization in ohmic contact with the doped region and arranged on the main horizontal surface; and
       a control metallization arranged on the back surface and in ohmic contact with the control electrode via the low ohmic current path.

2. The semiconductor device of claim 1, wherein the insulating region comprises a stack of at least two different dielectric layers arranged over each other.

3. The semiconductor device of claim 1, wherein the low ohmic current path is at least partially formed in an area of the semiconductor substrate adjoining the deep vertical trench.

4. The semiconductor device of claim 1, wherein the low ohmic current path is at least partially formed in the deep vertical trench.

5. The semiconductor device of claim 1, wherein the main horizontal surface is completely covered by the first metallization.

6. The semiconductor device of claim 1, wherein the insulating layer adjoins the insulating region.

* * * * *